United States Patent
Suzuki et al.

(10) Patent No.: US 12,230,124 B2
(45) Date of Patent: *Feb. 18, 2025

(54) ENCODING APPARATUS, ENCODING METHOD, DECODING APPARATUS, DECODING METHOD, TRANSMISSION SYSTEM, RECEIVING APPARATUS, AND PROGRAM

(71) Applicant: Sony Group Corporation, Tokyo (JP)

(72) Inventors: Shiro Suzuki, Kanagawa (JP); Shuichiro Nishigori, Tokyo (JP); Hirofumi Takeda, Kanagawa (JP); Jun Matsumoto, Kanagawa (JP)

(73) Assignee: Sony Group Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/464,603

(22) Filed: Sep. 11, 2023

(65) Prior Publication Data

US 2023/0419795 A1 Dec. 28, 2023

Related U.S. Application Data

(63) Continuation of application No. 17/255,537, filed as application No. PCT/JP2019/017711 on Apr. 25, 2019, now Pat. No. 11,823,557.

(30) Foreign Application Priority Data

Jul. 3, 2018 (JP) .................... 2018-126613

(51) Int. Cl.
 *G08B 6/00* (2006.01)
 *H03M 5/22* (2006.01)

(52) U.S. Cl.
 CPC ............... *G08B 6/00* (2013.01); *H03M 5/22* (2013.01)

(58) Field of Classification Search
 CPC ........ G08B 6/00; H03M 5/22; H03M 7/3059; H03M 7/70; G06F 3/016
 See application file for complete search history.

(56) References Cited

U.S. PATENT DOCUMENTS

| | | | |
|---|---|---|---|
| 5,855,553 | A | 1/1999 | Tajima et al. |
| 5,859,826 | A | 1/1999 | Ueno et al. |

(Continued)

FOREIGN PATENT DOCUMENTS

| | | |
|---|---|---|
| CN | 1639984 A | 7/2005 |
| CN | 101996413 A | 3/2011 |

(Continued)

OTHER PUBLICATIONS

International Search Report and English translation thereof mailed Jun. 4, 2019 in connection with International Application No. PCT/JP2019/017710.

(Continued)

*Primary Examiner* — Quan Zhen Wang
*Assistant Examiner* — Rajsheed O Black-Childress
(74) *Attorney, Agent, or Firm* — Wolf, Greenfield & Sacks, P.C.

(57) ABSTRACT

A system related to tactile reproduction is made more efficient by achieving a data amount reduction of a tactile signal while ensuring reproducibility of a tactile sense.

An encoding apparatus according to the present technology includes an encoding unit configured to encode tactile signals using different data formats between different regions of a human body. Therefore, for example, a data amount reduction of a tactile signal can be performed considering difficulty in perceiving tactile stimulation of a region, by reducing a data distribution of a tactile signal for (Continued)

a region with low tactile sensitivity using a difference in tactile sensitivity between regions of a human body, and the like.

15 Claims, 19 Drawing Sheets

(56) References Cited

U.S. PATENT DOCUMENTS

| | | | |
|---|---|---|---|
| 7,602,301 B1* | 10/2009 | Stirling | A61B 5/11 340/573.7 |
| 8,107,527 B1 | 1/2012 | Hobbs | |
| 9,264,094 B2 | 2/2016 | Daimou et al. | |
| 9,626,845 B2 | 4/2017 | Eagleman et al. | |
| 10,857,358 B2 | 12/2020 | Bouton et al. | |
| 11,095,894 B2 | 8/2021 | Jeon et al. | |
| 11,823,557 B2 | 11/2023 | Suzuki et al. | |
| 11,922,797 B2 | 3/2024 | Takeda et al. | |
| 2003/0227374 A1* | 12/2003 | Ling | G09B 21/003 340/407.1 |
| 2008/0082321 A1 | 4/2008 | Ide | |
| 2009/0066725 A1 | 3/2009 | Nogami et al. | |
| 2013/0039412 A1 | 2/2013 | Narroschke et al. | |
| 2014/0074696 A1 | 3/2014 | Glaser | |
| 2014/0122065 A1 | 5/2014 | Daimou et al. | |
| 2015/0070261 A1 | 3/2015 | Saboune et al. | |
| 2015/0241973 A1 | 8/2015 | Luden | |
| 2016/0012688 A1 | 1/2016 | Eagleman et al. | |
| 2016/0055726 A1 | 2/2016 | Aldossary et al. | |
| 2016/0310844 A1 | 10/2016 | Yamashita et al. | |
| 2016/0337734 A1 | 11/2016 | Efrati | |
| 2018/0091575 A1 | 3/2018 | Toba | |
| 2018/0300651 A1 | 10/2018 | Knott et al. | |
| 2020/0145661 A1 | 5/2020 | Jeon et al. | |
| 2021/0266010 A1 | 8/2021 | Nishigori et al. | |
| 2021/0272426 A1 | 9/2021 | Takeda et al. | |
| 2021/0366248 A1 | 11/2021 | Suzuki et al. | |
| 2024/0030936 A1 | 1/2024 | Nishigori et al. | |

FOREIGN PATENT DOCUMENTS

| | | |
|---|---|---|
| CN | 102971689 A | 3/2013 |
| CN | 104184721 A | 12/2014 |
| CN | 104423590 A | 3/2015 |
| CN | 106210743 A | 12/2016 |
| CN | 107710107 A | 2/2018 |
| EP | 0 732 082 A2 | 9/1996 |
| EP | 1 125 557 A2 | 8/2001 |
| EP | 2 034 390 A2 | 3/2009 |
| EP | 2 846 219 A1 | 3/2015 |
| JP | H8-215211 A | 8/1996 |
| JP | 2003-169832 A | 6/2003 |
| JP | 2009-069918 A | 4/2009 |
| JP | 2010-029309 A | 2/2010 |
| JP | 2011-523364 A | 8/2011 |
| JP | 2013-091114 A | 5/2013 |
| JP | 2014-239430 A | 12/2014 |
| JP | 2015-053038 A | 3/2015 |
| JP | 2015-053044 A | 3/2015 |
| JP | 2015-121918 A | 7/2015 |
| JP | 2016-202486 A | 12/2016 |
| JP | 2017-221631 A | 12/2017 |
| JP | 2018-010582 A | 1/2018 |
| JP | 2018-060313 A | 4/2018 |
| JP | 2018-097850 A | 6/2018 |
| JP | 2018-526722 A | 9/2018 |
| JP | 2019-185678 A | 10/2019 |
| WO | WO 2017/001293 A1 | 1/2017 |
| WO | WO 2017/175868 A1 | 10/2017 |
| WO | WO 2018/008217 A1 | 1/2018 |
| WO | WO 2018/092595 A1 | 5/2018 |

OTHER PUBLICATIONS

International Written Opinion and English translation thereof mailed Jun. 4, 2019 in connection with International Application No. PCT/JP2019/017710.
International Preliminary Report on Patentability and English translation thereof mailed Jan. 7, 2021 in connection with International Application No. PCT/JP2019/017710.
International Search Report and English translation thereof mailed Jul. 16, 2019 in connection with International Application No. PCT/JP2019/017709.
International Written Opinion and English translation thereof mailed Jul. 16, 2019 in connection with International Application No. PCT/JP2019/017709.
International Preliminary Report on Patentability and English translation thereof mailed Jan. 7, 2021 in connection with International Application No. PCT/JP2019/017709.
International Search Report and English translation thereof mailed Jul. 23, 2019 in connection with International Application No. PCT/JP2019/017711.
International Written Opinion and English translation thereof mailed Jul. 23, 2019 in connection with International Application No. PCT/JP2019/017711.
International Preliminary Report on Patentability and English translation thereof mailed Jan. 14, 2021 in connection with International Application No. PCT/JP2019/017711.
Hoshino et al., Jorro Beat: Improvment of Music Experience in the Bathroom by Shower Tactile Stimulation. The Transactions of Human Interface Society. Dec. 31, 2016;18(2):77-86.
Mizukami et al., Tactile Transmission by Higher-Level Perception Using Vibration of Shape Memory Alloy Thread. IPSJ Journal. Dec. 2007;48(12):3739-49.
Sakaguchi, Haptic Recognition System Based on Sensory Integration and Active Perception. Transactions of the Society of Instrument and Control Engineers. Aug. 31, 1995;31(8):1217-1226.

* cited by examiner

ENCODING APPARATUS, ENCODING METHOD, DECODING APPARATUS, DECODING METHOD, TRANSMISSION SYSTEM, RECEIVING APPARATUS, AND PROGRAM

CROSS-REFERENCE TO RELATED APPLICATIONS

The present application claims the benefit under 35 U.S.C. § 120 as a continuation application of U.S. application Ser. No. 17/255,537, filed on Dec. 23, 2020, now U.S. Pat. No. 11,823,557, which claims the benefit under 35 U.S.C. § 371 as a U.S. National Stage Entry of International Application No. PCT/JP2019/017711, filed in the Japanese Patent Office as a Receiving Office on Apr. 25, 2019, which claims priority to Japanese Patent Application Number JP2018-126613, filed in the Japanese Patent Office on Jul. 3, 2018, each of which applications is hereby incorporated by reference in its entirety.

TECHNICAL FIELD

The present technology relates to an encoding apparatus and a method of the same, a decoding apparatus and a method of the same, a transmission system, a receiving apparatus, and a program, and particularly to a technical field related to encoding, decoding, and transmission of a tactile signal for generating tactile stimulation.

BACKGROUND ART

In recent years, an application that applies tactile stimulation using a tactile presentation device being in contact with the skin of a human has been used in various scenes. Here, the "tactile presentation" means the generation of tactile stimulation.

For example, in a touch panel-equipped mobile terminal such as a smartphone, by applying tactile stimulation to a finger by vibrating a panel (or casing) at the time of a touch operation of the panel, a pseudo touch sense of a button is created.

In music listening, some apparatuses enhance deep bass sound by incorporating a tactile presentation device into a headphone casing, and applying tactile stimulation in synchronization with music reproduction.

In the field of computer games and virtual reality (VR), some apparatuses enhance immersive feeling of a user by interactively applying tactile stimulation in accordance with a scene by a tactile presentation device installed in a controller in accordance with an operation of the user.

In amusement facility, some apparatuses enhance realistic feeling of visitors by applying tactile stimulation using a tactile presentation device installed in a seat in a movie theater, an entertainment park, or the like in accordance with a scene.

Furthermore, in a research and development phase, in remotely controlling a robot and the like, some apparatuses help hazard anticipation by feeding back a vibration received by the robot or an operated target object, to a controller held by an operator, and causing the operator to intuitively detect a surrounding situation of the robot or the target object (e.g., disaster assistance robot <http://www.rm-.is.tohoku.ac.jp/quince_mech/#_8>)

Moreover, in the medical field, the research has been conducted for enhancing the accuracy of surgery by feeding back feeling (stiffness) felt when forceps of an endoscope touch an organ at the time of an operation of a surgical robot, to an operator (e.g., surgical support robot "da Vinci surgical system" <http://techon.nikkeibp.co.jp/article/FEATURE/20150217/4044 60/?P=2>)

On the other hand, as a tactile presentation device, an eccentric rotating mass (ERM) motor, a linear resonant actuator (LRA), and the like are often used, and many of these are assumed to be devices having a resonance frequency of a high frequency (about several hundred Hz) for tactile sensitivity of a human (e.g., refer to Patent Document 1 described below).

Furthermore, there is an example approach for further enhancing realistic feeling by preparing a plurality of tactile presentation devices, attaching the tactile presentation devices to the entire body, and applying tactile stimulation. (e.g. Synesthesia Suit <http://rezinfinite.com/ja/synesthesia-suit/>)

CITATION LIST

Patent Document

Patent Document 1: Japanese Patent Application Laid-Open No. 2016-202486

SUMMARY OF THE INVENTION

Problems to be Solved by the Invention

Here, in the case of preparing a plurality of tactile presentation devices and applying tactile stimulation to a plurality of portions of a human body as described above, signals indicating patterns of tactile stimulation, that is to say, tactile signals corresponding to a plurality of channels are prepared for each region, and processed. At this time, for enhancing realistic feeling, it is desirable to increase the number of regions to which tactile stimulation is applied, but an unnecessary increase in data amount required for tactile reproduction is undesirable from the aspect of system configuration.

Furthermore, in transmitting a tactile signal for tactile reproduction, and particularly in performing wireless transmission, the loss of coded data can be generated by the interruption on a transmission path.

In a case where data loss is generated, a receiving side transmits a data retransmission request to a transmitting side, and a data transmission delay is caused. This data transmission delay leads to a reproducibility decline of a tactile sense. Specifically, tactile reproduction is assumed to be reproduced in synchronization with content related to other feeling such as sound or a video, for example (hereinafter, described as "feeling content"), but in a case where the above-described transmission delay of a tactile signal occurs, tactile stimulation fails to be applied at a desired timing and synchronization fails to be achieved with other feeling content. This can possibly lead to a reproducibility decline of a tactile sense.

The present technology has been devised in view of the above-described circumstances, and the first object of the present technology is to make a system related to tactile reproduction more efficient, by achieving a data amount reduction of a tactile signal while ensuring reproducibility of a tactile sense.

Furthermore, the second object of the present technology is to prevent a reproducibility decline of a tactile sense that is caused by a transmission delay, by suppressing a transmission delay of a tactile signal that is caused by data loss on a transmission path.

Solutions to Problems

An encoding apparatus according to the present technology includes an encoding unit configured to encode tactile signals using different data formats between different regions of a human body.

Therefore, for example, a data amount reduction of a tactile signal can be performed considering a difference in tactile characteristic between regions of a human body, by reducing a data distribution of a tactile signal for a region with low tactile sensitivity using a difference in tactile sensitivity between regions of a human body, and the like.

An encoding method according to the present technology is an encoding method of encoding tactile signals using different data formats between different regions of a human body.

Also by such an encoding method, effects similar to those of the above-described encoding apparatus according to the present technology can be obtained.

A first program according to the present technology is a program for causing an information processing apparatus to implement an encoding function of encoding tactile signals using different data formats between different regions of a human body.

Bu such a first program, the above-described encoding apparatus according to the present technology is implemented.

Furthermore, a decoding apparatus according to the present technology includes a decoding unit configured to decode tactile signals encoded using different data formats between different regions of a human body.

Therefore, for example, a data amount reduction of a tactile signal can be performed considering a difference in tactile characteristic between regions of a human body, by reducing a data distribution of a tactile signal for a region with low tactile sensitivity using a difference in tactile sensitivity between regions of a human body, and the like.

In the above-described decoding apparatus according to the present technology, it is desirable that the decoding unit decodes tactile signals having data formats different between regions with different tactile characteristics of a human body.

Therefore, a data amount reduction of a tactile signal can be performed using a difference in tactile sensitivity and the like between regions of a human body.

In the above-described decoding apparatus according to the present technology, it is desirable that the decoding unit decodes tactile signals having data formats of the respective regions defined in such a manner as to vary a bit distribution for the regions in accordance with tactile sensitivity.

Therefore, a data amount reduction of a tactile signal can be performed considering a difference in tactile characteristic between regions.

In the above-described decoding apparatus according to the present technology, it is desirable that the decoding unit decodes tactile signals having different quantization bit lengths between the different regions.

Therefore, a data amount reduction of a tactile signal can be achieved by shortening a quantization bit length for a region with low tactile sensitivity (low sensitivity to the amplitude of tactile stimulation).

In the above-described decoding apparatus according to the present technology, it is desirable that the decoding unit decodes tactile signals having different sampling frequencies between the different regions.

Therefore, a data amount reduction of a tactile signal can be achieved by lowering a sampling frequency for a region with low tactile sensitivity (low sensitivity to the frequency of tactile stimulation).

In the above-described decoding apparatus according to the present technology, it is desirable that the decoding unit includes a format conversion unit configured to input tactile signals being different in at least either a quantization bit length or a sampling frequency between the different regions, and convert at least either a quantization bit length or a sampling frequency of at least any tactile signal of tactile signals of the respective regions.

Therefore, the need for providing a plurality of types of D/A converters that perform D/A conversion of tactile signals, in accordance with a difference in a quantization bit length or a sampling frequency between regions is eliminated.

In the above-described decoding apparatus according to the present technology, it is desirable that the decoding unit inputs the tactile signal to which index information indicating a type of the region is added, and performs decoding of the tactile signals of the respective regions on the basis of the index information.

Therefore, easiness and accuracy of the identification of a region of a tactile signal are enhanced.

Furthermore, a decoding method according to the present technology is a decoding method of decoding tactile signals encoded using different data formats between different regions of a human body.

Also by such a decoding method, effects similar to those of the above-described decoding apparatus according to the present technology can be obtained.

Moreover, a second program according to the present technology is a program for causing an information processing apparatus to implement a decoding function of decoding tactile signals encoded using different data formats between different regions of a human body.

Bu such a second program, the above-described decoding apparatus according to the present technology is implemented.

Furthermore, a transmission system according to the present technology includes a transmission apparatus including an encoding unit configured to generate coded data by performing encoding of arranging tactile signals of respective regions of a human body in accordance with priority orders of the respective regions, and a transmission unit configured to transmit the coded data, and a receiving apparatus including a receiving unit configured to receive the coded data transmitted by the transmission unit, and a decoding unit configured to perform decoding of the coded data received by the receiving unit, in accordance with the priority orders.

As described above, by transmitting tactile signals of the respective regions in the arrangement corresponding to priority orders, for example, it becomes possible to make data loss of a tactile signal of a region to be prioritized, such as a region with high tactile sensitivity, less likely to occur, and further decoding tactile signals to be transmitted in this manner, in accordance with the priority orders, even if data loss on a transmission path occurs, the data loss does not occur in a tactile signal of a region to be prioritized, only the received tactile signal of the region to be prioritized can be regarded as a target of tactile reproduction.

Furthermore, a receiving apparatus according to the present technology includes a receiving unit configured to receive, from a transmission apparatus configured to generate coded data by performing encoding of arranging tactile signals of respective regions of a human body in accordance with priority orders of the respective regions, the coded data, and a decoding unit configured to perform decoding of the coded data received by the receiving unit, in accordance with the priority orders.

By the transmission apparatus transmitting tactile signals of the respective regions in the arrangement corresponding to priority orders, for example, it becomes possible to make data loss of a tactile signal of a region to be prioritized, such as a region with high tactile sensitivity, less likely to occur, and further decoding tactile signals to be transmitted in this manner, in accordance with the priority orders, even if data loss on a transmission path occurs, the data loss does not occur in a tactile signal of a region to be prioritized, only the received tactile signal of the region to be prioritized can be regarded as a target of tactile reproduction.

In the above-described receiving apparatus according to the present technology, it is desirable that tactile signals of the respective regions are tactile signals of the respective regions having different tactile characteristics of a human body.

Therefore, the tactile reproduction can be performed for each of the regions having different tactile characteristics.

In the above-described receiving apparatus according to the present technology, it is desirable that the transmission apparatus transmits the tactile signals arranged in order from the regions with the higher priority orders, and the decoding unit returns acknowledge to the transmission apparatus upon reception of at least a tactile signal of the region with the highest priority order excluding a region with the lowest priority order.

Therefore, a tactile signal of a region with a high priority order becomes equivalent to transmission of a signal using a short packet.

In the above-described receiving apparatus according to the present technology, it is desirable that the priority order is a priority order that is based on a height of tactile sensitivity.

Therefore, for a region in which tactile stimulation is easily perceived from the aspect of sensitivity to tactile stimulation, data loss of a tactile signal can be made less likely to occur.

In the above-described receiving apparatus according to the present technology, it is desirable that the transmission apparatus transmits tactile signals after giving redundancy to the regions with the high priority orders, and the decoding unit returns acknowledge to the transmission apparatus upon reception of at least one tactile signal of the tactile signals of the regions to which the redundancy is given.

Therefore, it becomes possible to make data loss of a tactile signal less likely to occur.

Furthermore, a decoding method according to the present technology is a decoding method of performing decoding of coded data received from a transmission apparatus configured to generate coded data by performing encoding of arranging tactile signals of respective regions of a human body in accordance with priority orders of the respective regions, in accordance with the priority orders.

Also by such a decoding method, effects similar to those of the above-described receiving apparatus according to the present technology can be obtained.

Moreover, a third program according to the present technology is a program for causing an information processing apparatus to implement a function of performing decoding of coded data received from a transmission apparatus configured to generate coded data by performing encoding of arranging tactile signals of respective regions of a human body in accordance with priority orders of the respective regions, in accordance with the priority orders.

Bu such a third program, the above-described receiving apparatus according to the present technology is implemented.

Effects of the Invention

According to the present technology, first, a system related to tactile reproduction can be made more efficient by achieving a data amount reduction of a tactile signal while ensuring reproducibility of a tactile sense.

Furthermore, according to the present technology, secondly, a reproducibility decline of a tactile sense that is caused by a transmission delay can be prevented by making a transmission delay of a tactile signal that is caused by data loss on a transmission path, less likely to occur.

Note that the effect described here is not necessarily limited, and may be any effect described in the present disclosure.

MODE FOR CARRYING OUT THE INVENTION

Hereinafter, embodiments according to the present technology will be described in the following order with reference to the attached drawings.

<1. First Embodiment>
[1-1. Overview of Tactile Reproduction System]
[1-2. Configuration of Encoding Apparatus]
[1-3. Configuration of Decoding Apparatus]
[1-4. Tactile Reproduction Method According to First Embodiment]
(Encoding Method)
(Functional Configuration of Encoding Side)
(Decoding Method)
(Functional Configuration of Decoding Side)
[1-5. Conclusion of First Embodiment]
2. Second Embodiment
[2-1. Overview of Tactile Reproduction System]
[2-2. Configuration of Transmission Apparatus]
[2-3. Configuration of Receiving Apparatus]
[2-4. Tactile Reproduction Method According to Second Embodiment]
(Functional Configuration of Transmitting Side)
(Functional Configuration of Receiving Side)
[2-5. Conclusion of Second Embodiment]
<3. Present Technology>

Here, in this specification, each term is defined as follows.

Tactile stimulation: physical phenomenon for causing a human to perceive a tactile sense, such as a vibration phenomenon, for example.

Tactile presentation: to generate tactile stimulation.

Tactile signal: signal indicating a pattern of tactile stimulation, such as a signal indicating a vibration waveform, for example.

Recipient: person who receives tactile presentation.

Tactile characteristic: characteristic regarding a tactile sense of a human. Varies depending on the region (hand, face, foot and the like).

Tactile sensitivity: sensitivity for subjectively determining the strength of tactile stimulation. Varies depending on the receptor or the region in a human body. High tactile sensitivity means that a tactile signal can be easily perceived.

Coded data: data obtained by encoding a tactile signal. A stream and a frame serve as a more specific concept.

Note that, the "tactile sensitivity" here includes two types including tactile sensitivity regarding the amplitude of tactile stimulation, and tactile sensitivity regarding the frequency of tactile stimulation. In this specification, unless otherwise stated, "tactile sensitivity" involves no distinction between an amplitude and a frequency.

1. First Embodiment

[1-1. Overview of Tactile Reproduction System]

Figure 1:
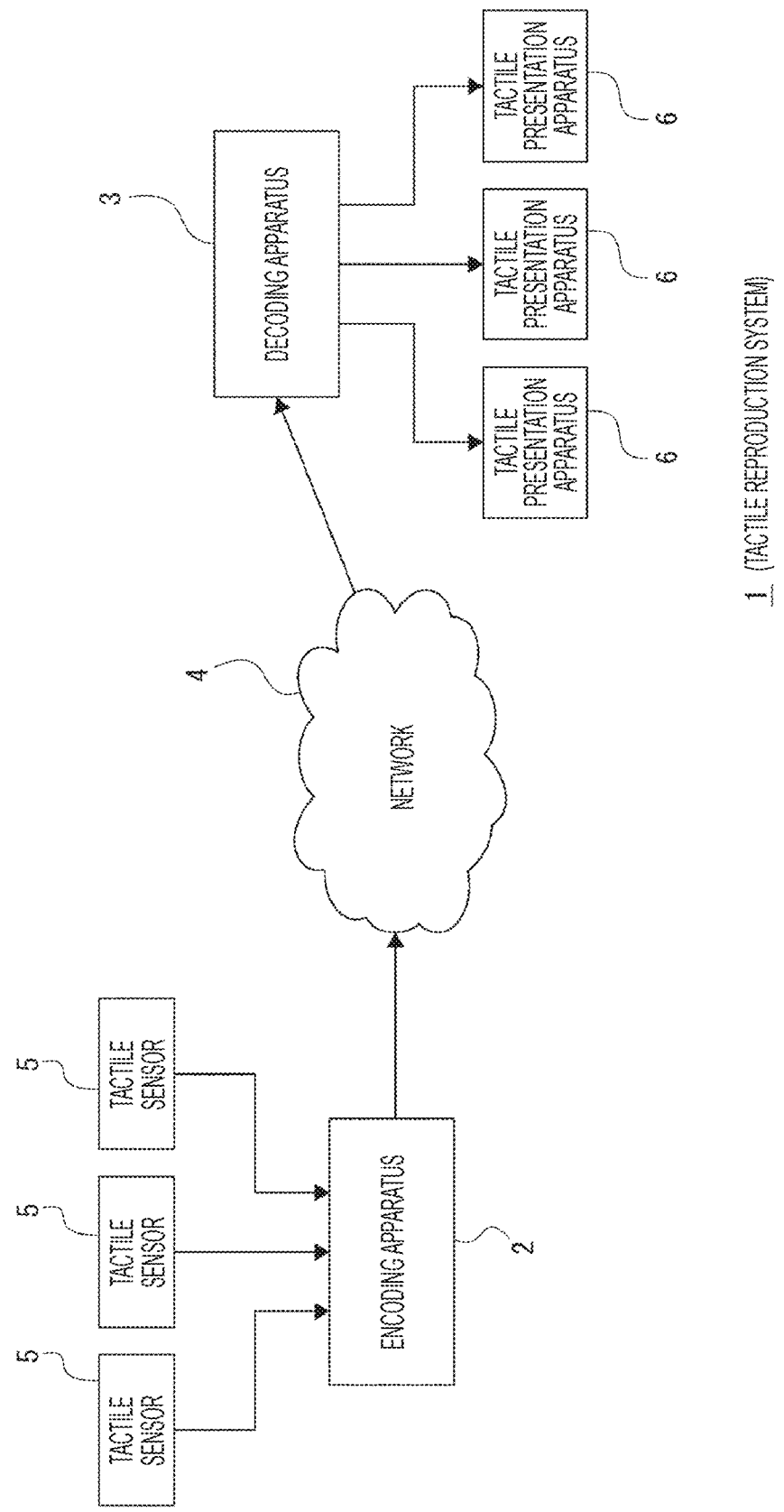
FIG. 1 is a diagram illustrating a configuration example of a tactile reproduction system including a decoding apparatus according to a first embodiment according to the present technology.

FIG. 1 illustrates a configuration example of a tactile reproduction system 1 including an encoding apparatus (encoding apparatus 2) and a decoding apparatus (decoding apparatus 3) according to the first embodiment according to the present technology.

The tactile reproduction system 1 includes the encoding apparatus 2 to which a plurality of tactile sensors 5 is connected, the decoding apparatus 3 configured to be able to perform communication with the encoding apparatus 2 via a predetermined network 4, and a plurality of tactile presentation apparatuses 6 connected with the decoding apparatus 3.

The tactile sensor 5 is a part/component that performs sensing of tactile stimulation. In this example, a vibration sensor such as a piezo pickup sensor or an acceleration sensor is used. The tactile sensor outputs vibration or a motion as a voltage change by being brought into contact with a target object of sensing, that is to say, a human body (or vibrating object) in this example.

In this example, each of the tactile sensors 5 is connected to the encoding apparatus 2 in a wired manner, and each of the contact sensors 5 is attached to a different region (or vibrating object) of a human body as a target object, and senses tactile stimulation generated in the corresponding region.

The encoding apparatus 2 includes a computer device such as, for example, a central processing unit (CPU) and a digital signal processor (DSP), performs encoding of a detection signal (tactile signal) output by each of the tactile sensors 5, in compliance with a predetermined data format, and transmits an encoded tactile signal, that is to say, coded data to the decoding apparatus 3 via the predetermined network 4 such as the internet, for example.

The decoding apparatus 3 includes a computer device such as a CPU and a DSP, decodes the coded data received via the network 4, and drives each of the tactile presentation apparatuses 6 on the basis of the decoded tactile signal.

The tactile presentation apparatus 6 is assumed to be a device that generates tactile stimulation. In this example, a device such as a vibrator or an actuator is used.

In this example, each of the tactile presentation apparatuses 6 is attached to a different region in a human body of a recipient, and is reproduces tactile stimulation sensed by the corresponding tactile sensor 5.

The tactile reproduction system 1 of this example is formed as a system that reproduces a tactile sense of each region perceived by a person to which the tactile sensor 5 is attached, in a recipient, and as a system that can handle a case where the person and the recipient are arranged remotely.

Furthermore, with the configuration of the tactile reproduction system 1 that is illustrated in FIG. 1, it becomes possible to perform reproduction of a tactile sense in approximate real time by transmitting a tactile signal obtained by sensing performed by the tactile sensor 5, to the decoding apparatus 3 side via the network 4.

Note that, in the example of FIG. 1, the number of tactile sensors 5 and the number of tactile presentation apparatuses 6, that is to say, the number of regions of a human body from which tactile stimulation is sensed and reproduced is set to three, but the number of tactile sensors 5 and the number of tactile presentation apparatuses 6 are not limited to this.

[1-2. Configuration of Encoding Apparatus]

Figure 2:
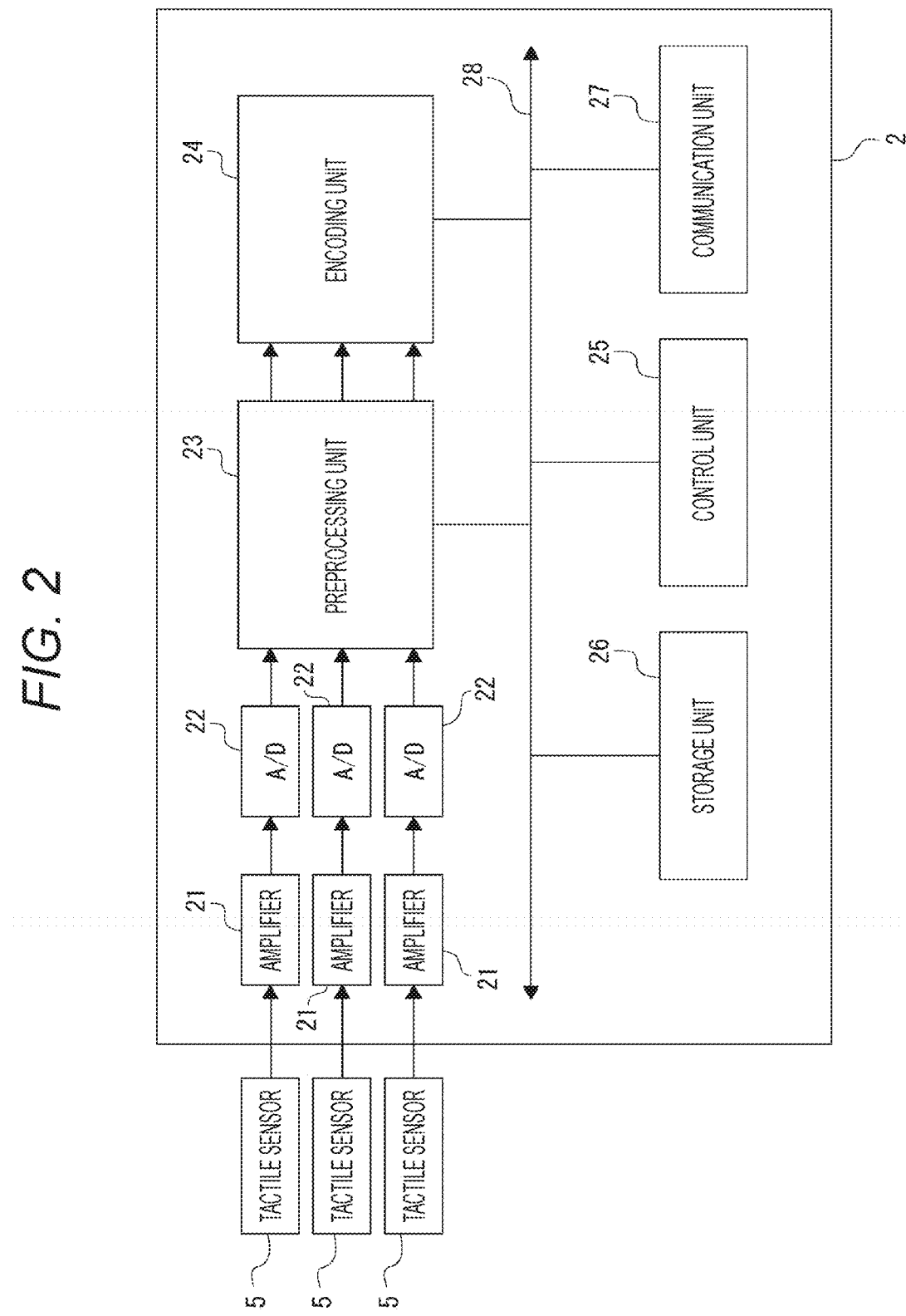
FIG. 2 is a diagram for describing an inner configuration example of an encoding apparatus according to the first embodiment.

FIG. 2 is a diagram for describing an inner configuration example of the encoding apparatus 2. Note that FIG. 2 illustrates the tactile sensors 5 illustrated in FIG. 1, together with an inner configuration example of the encoding apparatus 2.

As illustrated in the drawing, the encoding apparatus 2 includes a plurality of amplifiers 21, a plurality of A/D converters 22, a preprocessing unit 23, an encoding unit 24, a control unit 25, a storage unit 26, a communication unit 27, and a bus 28.

As illustrated in the drawing, the preprocessing unit 23, the encoding unit 24, the control unit 25, the storage unit 26, and the communication unit 27 are connected via the bus 28 and enabled to perform data communication with each other.

A detection signal from each of the tactile sensors 5 is input to a corresponding one of the amplifiers 21, adjusted to an appropriate dynamic range, and then, input to a corresponding one of the A/D converters 22, and subjected to analog/digital conversion (A/D conversion).

Each A/D-converted detection signal (that is, a tactile signal of each region) is input to the preprocessing unit 23. In the preprocessing unit 23, various types of digital signal processing such as noise removal and calibration of a sensor characteristic of the tactile sensor 5 are performed.

Each tactile signal having been subjected to signal processing performed by the preprocessing unit 23 is input to the encoding unit 24.

The encoding unit 24 includes a DSP, for example, and encodes each of the input tactile signals in compliance with a predetermined data format.

The control unit 25 includes a microcomputer including a CPU, a read only memory (ROM), a random access memory (RAM), and the like, for example, and controls the entire encoding apparatus 2 in accordance with a program stored in the ROM.

For example, the control unit 25 performs data communication with an external device via the communication unit 27.

The communication unit 27 is configured to be able to perform data communication with an external device via the network 4, and the control unit 25 is configured to be able to perform data communication with an external device (especially, the decoding apparatus 3 in this example) connected to the network 4, via the communication unit 27. In particular, the control unit 25 is configured to be able to transmit the tactile signal encoded by the encoding unit 24, to the decoding apparatus 3 via the communication unit 27.

The storage unit 26 comprehensively represents a storage device such as a hard disk drive (HDD) and a solid state drive (SSD), for example, and is used for various types of data storage in the encoding apparatus 2. For example, data necessary for control of the control unit 25 is stored into the storage unit 26. Furthermore, on the basis of control of the control unit 25, an encoded tactile signal can also be stored into the storage unit 26.

[1-3. Configuration of Decoding Apparatus]

Figure 3:
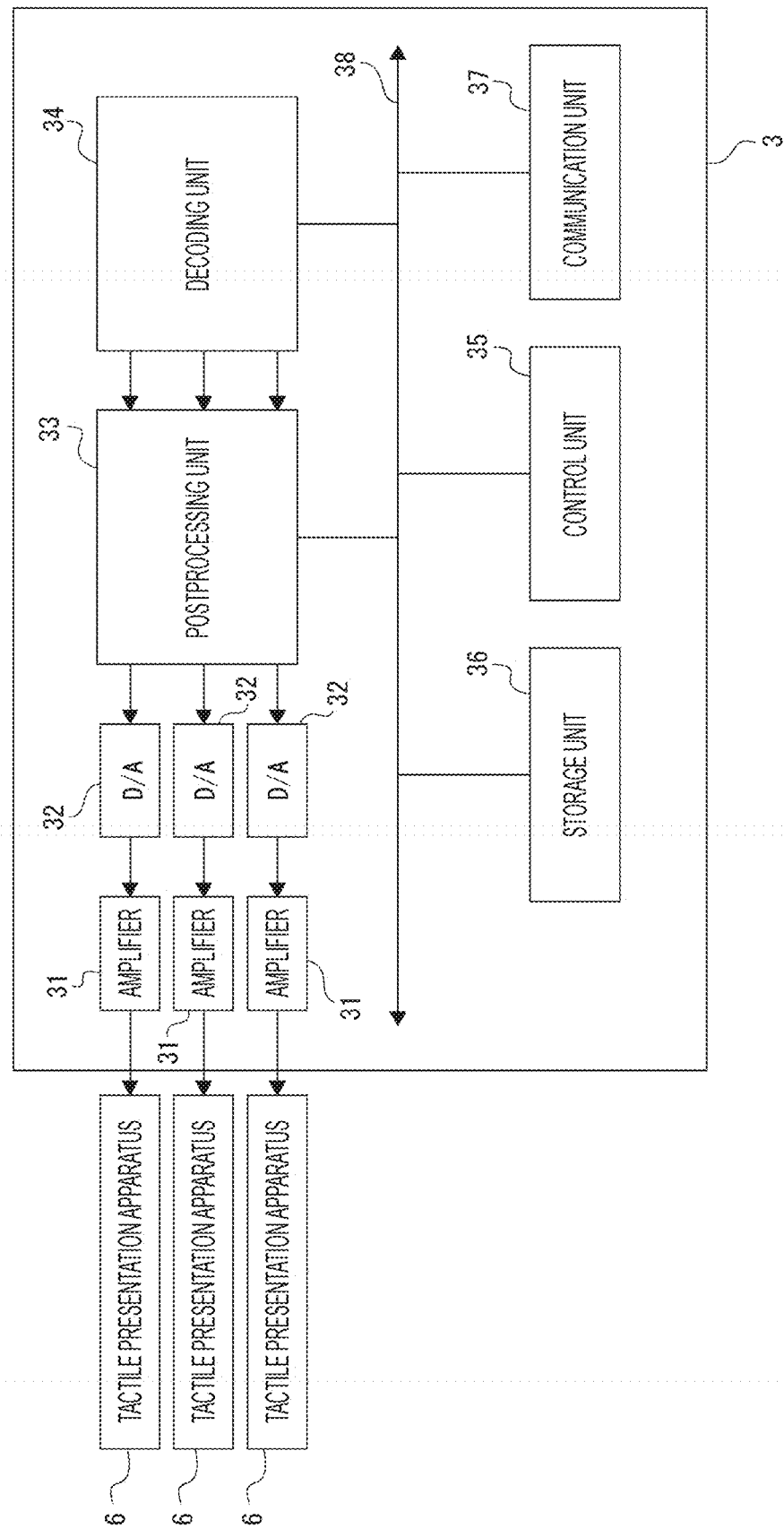
FIG. 3 is a diagram for describing an inner configuration example of a decoding apparatus according to the first embodiment.

FIG. 3 is a diagram for describing an inner configuration example of the decoding apparatus 3, and illustrates the tactile presentation apparatuses 6 illustrated in FIG. 1, together with the inner configuration example of the decoding apparatus 3.

The decoding apparatus 3 includes, a plurality of amplifiers 31, a plurality of D/A converters 32, a postprocessing unit 33, a decoding unit 34, a control unit 35, a storage unit 36, a communication unit 37, and a bus 38.

The postprocessing unit 33, the decoding unit 34, the control unit 35, the storage unit 36, and the communication unit 37 are connected via the bus 38 and enabled to perform data communication with each other.

The control unit 35 includes a microcomputer including, for example, a CPU, a ROM, a RAM, and the like, and controls the entire decoding apparatus 3 by executing processing in accordance with a program stored in the ROM.

For example, the control unit 35 performs data communication with an external device via the communication unit 37.

The communication unit 37 is configured to be able to perform data communication with an external device via the network 4, and the control unit 35 is configured to be able to perform data communication with an external device (especially, the encoding apparatus 2 in this example) connected to the network 4, via the communication unit 37.

The control unit 35 causes a tactile signal (encoded tactile signal) received by the communication unit 37 from the encoding apparatus 2, to be input to the decoding unit 34.

The storage unit 36 comprehensively represents a storage device such as an HDD and an SSD, for example, and is used for various types of data storage in the decoding apparatus 3. For example, data necessary for control of the control unit 35 is stored into the storage unit 36.

The decoding unit 34 obtains a tactile signal of each region by decoding the encoded tactile signal in compliance with a predetermined data format. The tactile signal of each region that has been obtained by the decoding unit 34 is input to the postprocessing unit 33.

The postprocessing unit 33 performs, as necessary, signal processing such as the calibration of the tactile presentation apparatuses 6 and predetermined filter processing on the input tactile signal of each region.

Each tactile signal having passed through the postprocessing unit 33 is input to the corresponding one D/A converter 32 and subjected to digital/analog conversion (D/A conversion), and then, adjusted to an appropriate dynamic range by the corresponding one amplifier 31, and output to the corresponding one tactile presentation apparatus 6.

Therefore, each of the tactile presentation apparatuses 6 is driven on the basis of the tactile signal, and tactile stimulation corresponding to each region of the user can be generated.

Note that the above description has been given only of a tactile signal, but a voice signal or a video signal may be transmitted to the decoding apparatus 3 side together with a tactile signal, and sound or a video can also be provided to a recipient.

[1-4. Tactile Reproduction Method According to First Embodiment]

(Encoding Method)

Hereinafter, a tactile reproduction method according to the first embodiment will be described.

The tactile reproduction method according to the first embodiment is a method focused on a tactile characteristic of a human.

Figure 4:
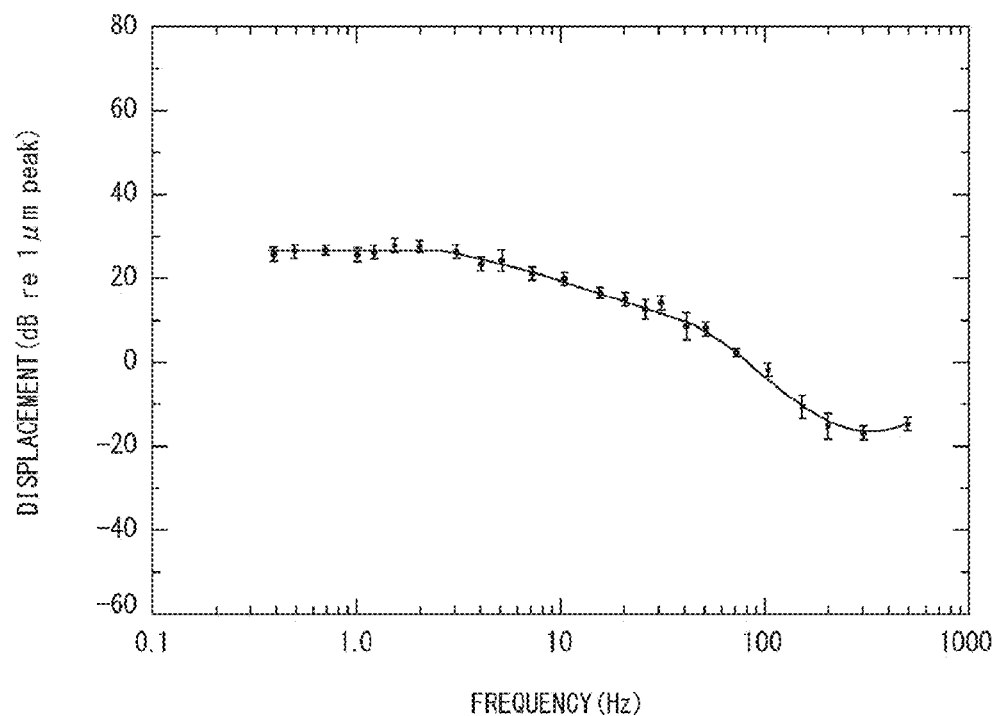
FIG. 4 is an explanatory diagram of a vibration detection threshold curve.

As an indication of tactile sensitivity of a human, a vibration detection threshold curve illustrated in FIG. 4 has been reported. Note that, in FIG. 4, a horizontal axis indicates a frequency and a vertical axis indicates the magnitude of an amplitude of tactile stimulation (vibration: the amplitude of a displacement in this example).

The vibration detection threshold curve illustrated in FIG. 4 indicates whether or not a human feels the vibration as a tactile sense, that is, indicates an example of tactile sensitivity investigated through an experiment. A human cannot perceive vibration smaller than the curve as a tactile sense.

Here, it has been generally known that a plurality of receptors for perceiving a tactile sense exists under the skin of a human. As representative receptors, Meissner, Merkel, Ruffini, and Pacini are known.

Meissner and Pacini are also referred to as "FA 1" and "FA 2", respectively, and "FA" stands for "Fast Adapting". Merkel and Ruffini are also referred to as "SA 1" and "SA 2", respectively, and "SA" stands for "Slow Adapting".

Figure 5:
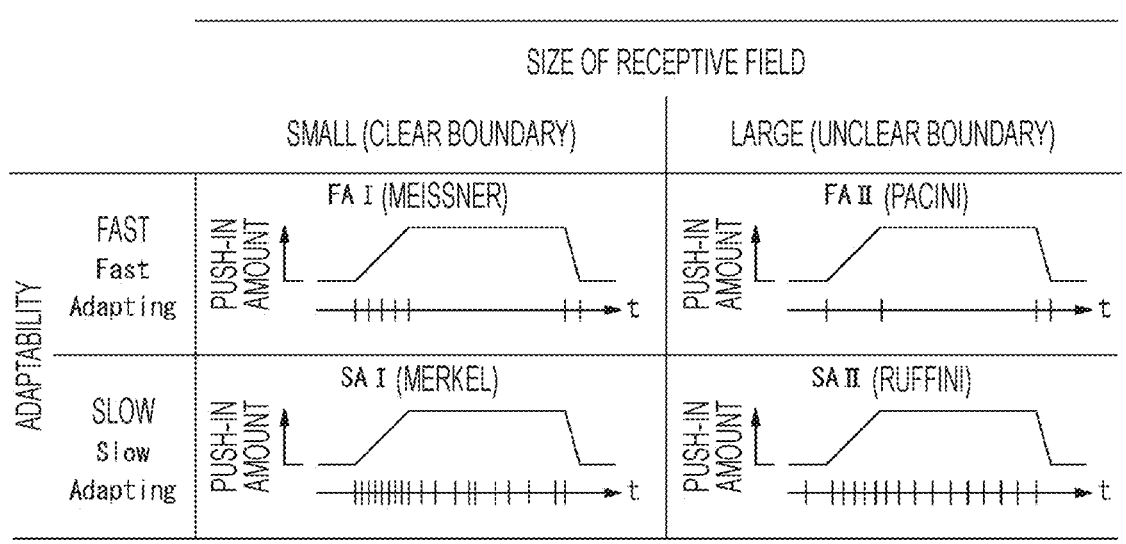
FIG. 5 is a diagram illustrating an example of a neural firing distribution for each receptor.

FIG. 5 illustrates a neural firing distribution of each receptor that is obtainable when an object is gradually pushed to skin, held for a while, and then, the object is detached from the skin.

While the object is being pushed, Merkel (SA 1) continuously performs neural firing, and is assumed to detect strength (displacement, pressure). In a section until a push-in amount of the object becomes constant, that is, Meissner (FA 1) is assumed to perform speed detection. In a section in which a push-in amount is changing, that is, Pacini (FA 2) is assumed to perform acceleration detection.

Figure 6:
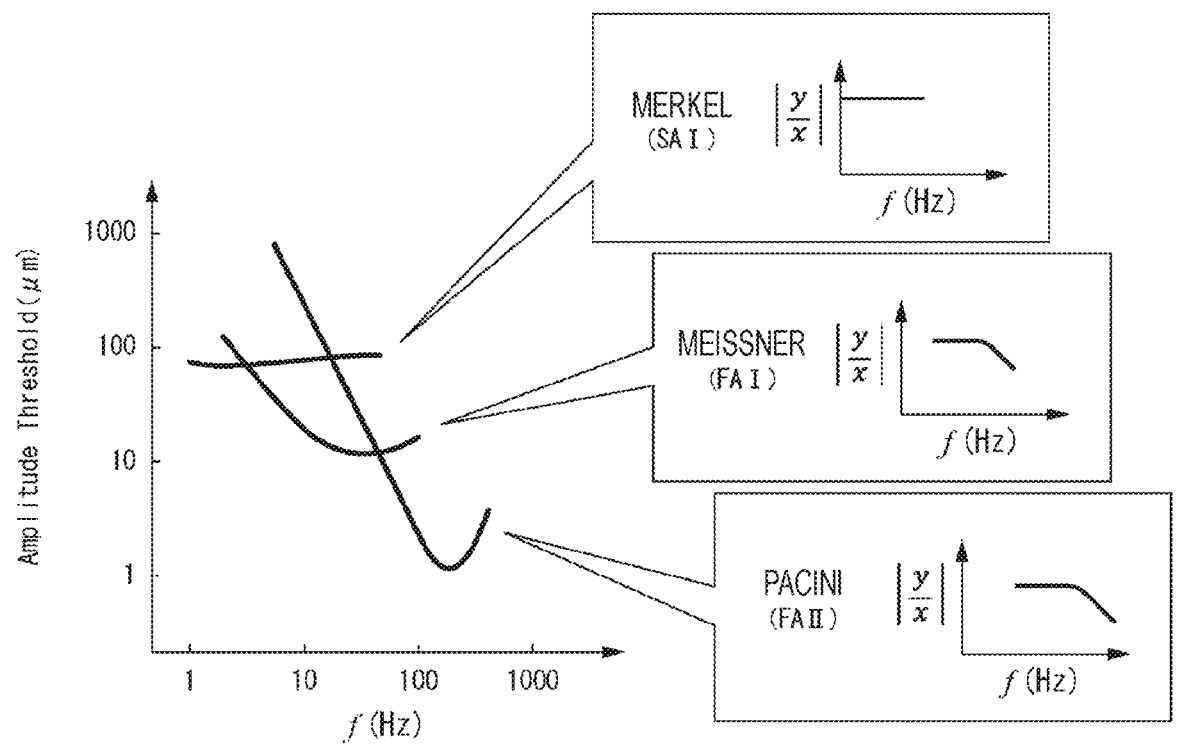
FIG. 6 is an explanatory diagram of a vibration detection threshold curve of each receptor.

FIG. 6 illustrates a vibration detection threshold curve of each receptor. The curve illustrated in FIG. 4 does not indicate a characteristic of an individual receptor, but indicates a characteristic obtained by combining tactile senses obtained by a plurality of receptors as illustrated in FIG. 6.

The vibration detection threshold curves illustrated in FIGS. 4 and 6 indicate that a human can feel vibration up to about 1 kHz as tactile stimulation. Furthermore, although these diagrams do not illustrate values equal to or larger than 1 kHz, it has been known that, actually, a human can perceive vibration at the frequency of several kHz as tactile stimulation while the sensitivity rapidly declines in a bandwidth equal to or larger than 1 kHz.

In a conventional application of tactile reproduction, in most cases, vibration of about 200 Hz at the most is targeted. This is attributed to the fact that the highest tactile sensitivity of a human is obtained at about 200 Hz.

However, as described above, it has been revealed from various past experiments that a human can feel vibration up to 1 kHz as a tactile stimulation, and there is no choice but to say that it is difficult for the conventional application to reproduce a tactile sense having a high sense of reality.

For example, vibration caused when a cork of a bottle is pulled out actually includes a high frequency such as several kHz. If vibration up to several hundreds 100 Hz of the vibration is reproduced, a tactile sense totally different from an actual tactile sense is obtained.

In view of the foregoing, in this example, a sense of reality is further enhanced by widening a bandwidth of characteristics of a tactile signal and the tactile presentation apparatus 6 to about 1 kHz.

Specifically, in this example, a method of obtaining a tactile signal by sensing tactile stimulation such as vibration that has been generated in reality, and performing tactile presentation in accordance with the tactile signal is employed.

In recent years every piece of information is digitalized and used. Similarly, handling of digitalized tactile signals will be considered.

A digitalized data amount can be considered on the basis of a bit depth necessary per unit time, that is, a bit rate. For example, in the vibration detection threshold curve illustrated in FIG. 4, a region that can be felt by a human is at least 50 dB (−20 dB to 30 dB) or more on the vertical axis and about 1000 Hz on the horizontal axis. In this example, in view of a distribution of tactile signals actually felt by a human, signals in a range of +20 dB from the threshold curve are sensed.

Figure 7:
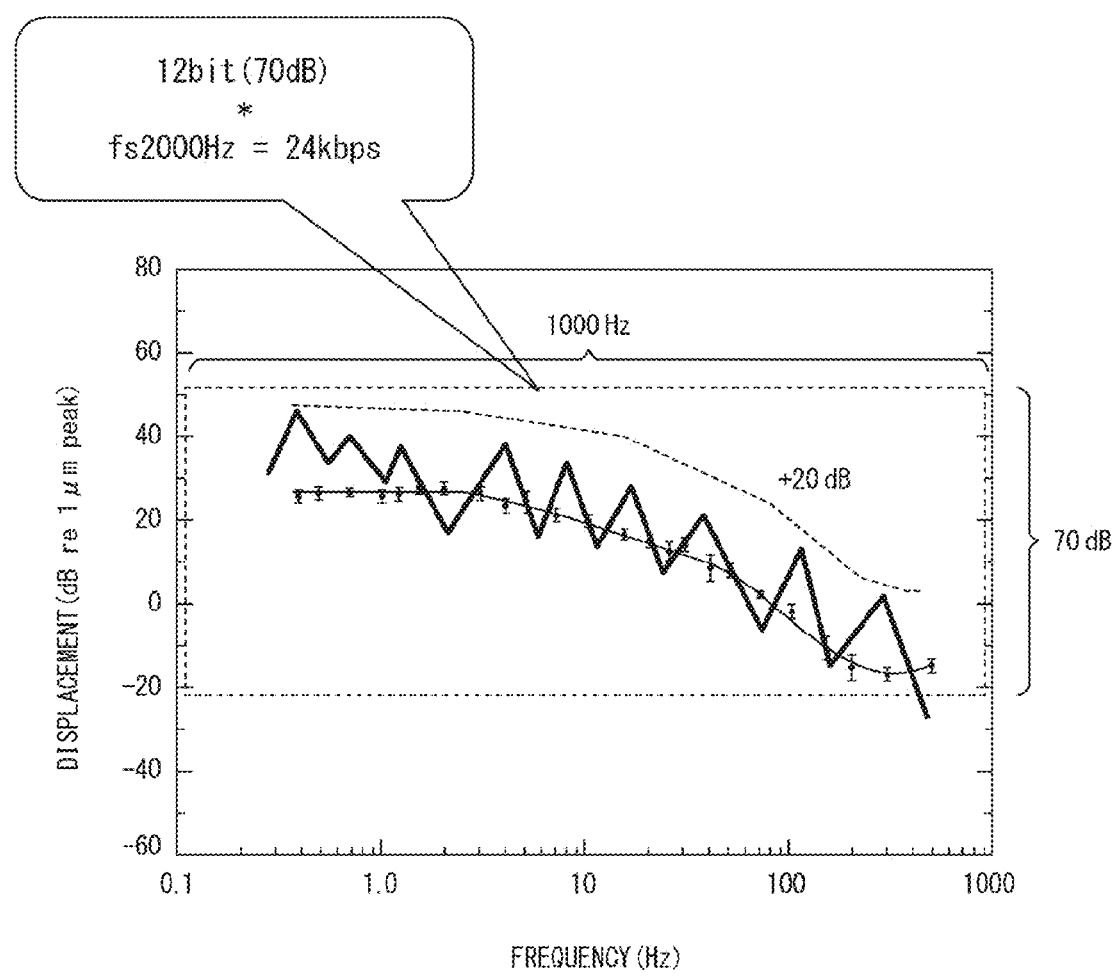
FIG. 7 is a diagram exemplifying an amplitude range and a frequency range that are targeted in digitalization of a tactile signal.

Specifically, as illustrated in FIG. 7, a range of vibration is assumed to be 70 dB (−20 dB to 50 dB).

In a case where the signal is digitalized by linear pulse code modulation (LPCM), because an amplitude that can be represented by one bit is 6 dB, 12 bits are necessary as for the vertical axis, and 2000 Hz (sample/sec) being a double sampling frequency is necessary for reproducing up to 1000 Hz. Thus, a necessary bit rate B0 is obtained by the following formula [1].

$$B0=12 \text{ bit/sample} \times 2000 \text{ sample/sec}=24 \text{ kbit/sec} \quad [1]$$

Because the value itself is extremely small as compared with a bit rate=700 kbps/ch of CD being a representative format of a voice signal, for example, if the tactile signal is additionally incorporated into a certain system, a large problem seems to hardly occur.

However, as described above, it has been seen that a bandwidth of tactile signals that can be felt by a human extends up to several kHz. For example, in a case where tactile signals are reproduced up to 2000 Hz, a bit rate becomes a double of 48 kbit/sec as compared with Formula [1].

Furthermore, unlike a visual sense (two eyes) and an auditory sense (two ears), tactile senses exist everywhere on the body surface of a human. Tactile senses exist at ten points in the fingertips of both hands, and if tactile signals of all of these points are to be handled, a bit rate further increases to 480 kbit/sec, which is a tenfold bit rate. If the number of points are increased by considering each joint of a finger and a palm, a bit rate dramatically increases.

Moreover, basically, a tactile signal is a one-dimensional signal, but a physical phenomenon of vibration can be considered in three axes (x, y, z). If all of these are handled, a necessary bit rate further increases to 1440 kbit/sec, which is a threefold bit rate, but this value is a large value exceeding 1411 kbit/sec of audio CD.

In this manner, although a bit rate regarding one tactile signal is not so large, if a tactile sense that can be felt by a human is considered, an immense amount is required, and large load is surely applied onto a system that handles tactile signals.

In view of the foregoing, in the present embodiment, attention is paid to a difference in tactile sensitivity between regions of a human body.

The types, distributions, and sensitivities of receptors greatly vary depending on the region of a human body, and its feature is represented by a model referred to as so-called "somatic homunculus" or "sensory homunculus" (for example, refer to "http://web2.chubu-gu.ac.jp/web_labo/mikami/brain/32/index-32.html" and the like).

These figures of "somatic homunculus" or "sensory homunculus" quantitatively illustrate each region in a deformed manner in accordance with the size of a responsible region of a brain that preprocesses a tactile sense of a corresponding region of a human body. However, this does not directly illustrates a difference in type, distribution, or sensitivity of tactile receptor between regions. Furthermore, the types, distributions, and sensitivities of tactile receptors of each region of a human are not completely investigated and revealed.

However, because a difference in tactile sensitivity between regions can be sufficiently realized qualitatively and quantitatively from the daily life of a human, by using a hand instead of foot for a delicate work that uses a tactile sense, or by having difficulty in feeling roughness of an object like a hand, by use of a belly or a back, it can be easily conceivable that regions do not have exactly the same tactile characteristic. As an easy-to-understand example, in particular, a large number of reports and investigations have revealed that a finger has a fingerprint, and has higher sensitivity to a tactile sense due to the fingerprint. Because a back and a belly do not have fingerprints, it is considered to be difficult to handle tactile signals only by a single encoding method.

Furthermore, it has been widely known that, if a human concentrates on one feeling, sensitivities to other feelings become weak. Specifically, in a case where a human is evaluating only sound, the human is sensitive to a sound quality deterioration. However, in a case where a human is simultaneously evaluating sound and a video, while the human becomes sensitive to a deterioration in video, but the human becomes less sensitive to a deterioration in sound. This is a phenomenon occurring due to the perceptual mechanism of a human that prioritizes a visual sense over an auditory sense.

Furthermore, even in the case of sensing only sound, if attention is focused on speech of a specific speaker from sound from various sound sources, only the sound can be heard clearly. This has been known as a so-called cocktail-party effect through the ages.

Moreover, even in the case of sensing only a video, a human does not recognize all target objects falling within a field of view. The human is always making a choice by finding out a family or an acquaintance from a crowd by removing advertising displays and buildings from a town, or deciphering emotions by paying attention particularly to a face (expression) thereof.

Such an effect can also be applied to an individual tactile sense. For example, when attention is focused on a tactile sense of a hand, while sensitivity of the hand is maximally used, sensitivities to other regions sometimes decline instead. For example, while moderate wind onto a foot is felt when a human do nothing, wind on foot can possibly be unfelt when a human is concentrating on a delicate work using a hand.

In this manner, feeling of a human with respect to a physical amount is not absolute, and a property greatly varies depending on a region to which a human pays attention. Perception encoding technologies of sound and a video have been widely generalized, and these technologies can be said to use the feeling characteristic of the human. These technologies have been developed because the mechanisms of an auditory sense and a visual sense have been significantly revealed and the mechanisms are actively used.

On the other hand, although many points remain unrevealed as to perceptual mechanisms of a tactile sense such as a tactile receptor as a sensor in particular, by using a research on a processing region of a brain for a tactile sense, and an effect that can be naturally felt and perceived in daily life, it can be said that it is possible to implement novel efficient encoding, transmission, and decoding of tactile signals.

Nevertheless, a technology as to efficient encoding, transmission, and decoding of tactile signals that use tactile characteristic of a human that are similar to the cases of an auditory sense and a visual sense have not been established yet in the current situation.

Because tactile senses are distributed over the entire body of a human body, it is considered that the tactile presentation apparatuses 6 are attached to various positions in the human body, and a plurality of tactile presentation devices vibrating independently is used.

Figure 8:
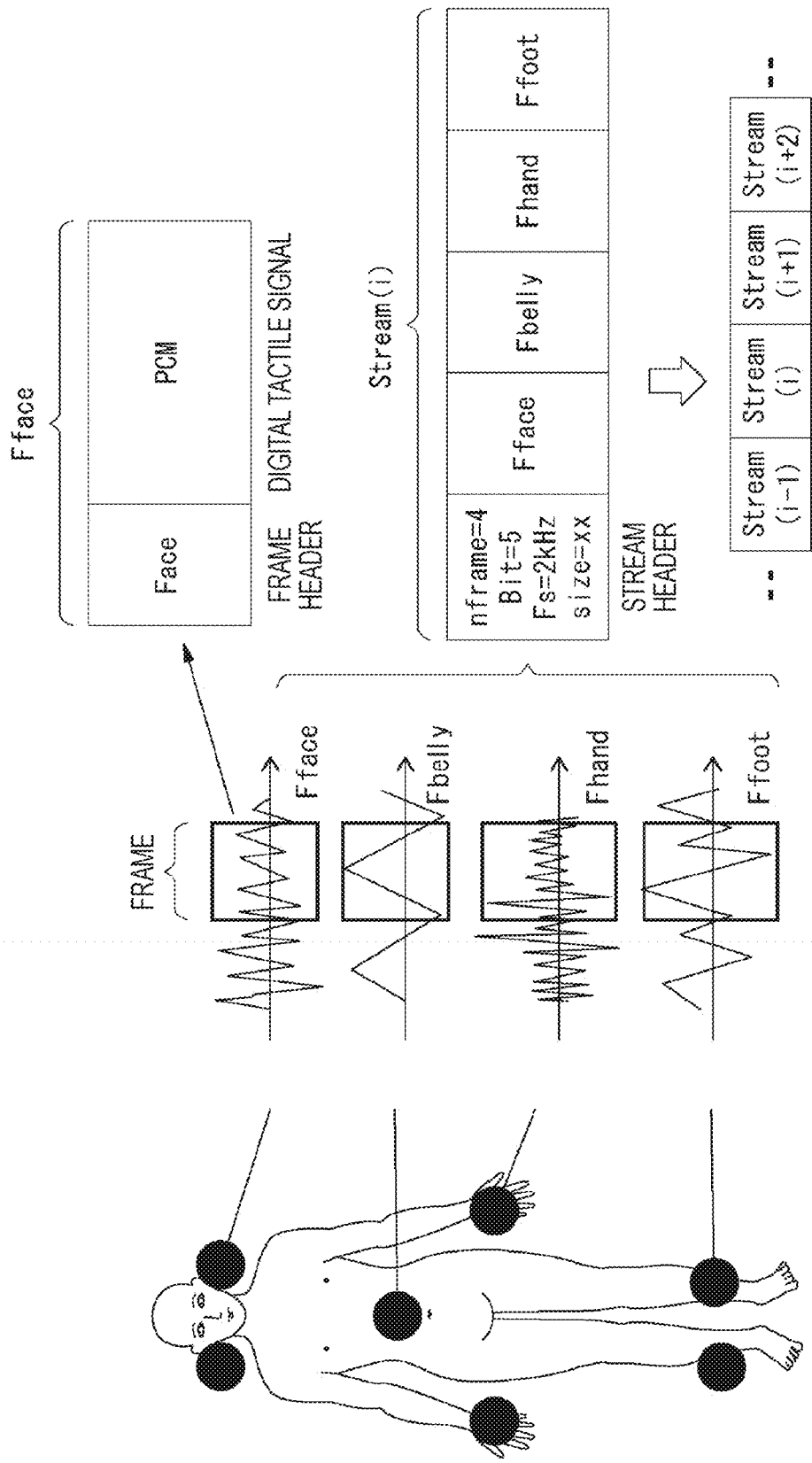
FIG. 8 is a diagram illustrating an attachment example of a tactile presentation apparatus to each region of a human body and a data structure example of a tactile signal of each region.

FIG. 8 is illustrated as a specific example.

In the example illustrated in FIG. 8, tactile reproduction devices that generate vibration of an object are attached to regions other than a hand and a fingertip of a human such as a face, a belly, and a foot, and vibration is added to the regions. As audio, basically, signals corresponding to 2 ch (channels) of both ears are reproduced, but depending on the cases, audio signals of 5.1 ch, 7.1 ch, and more channels are reproduced in some cases. At this time, for performing desired reproduction, a direction and a speaker from which an audio signal of each channel is to be reproduced need to be determined.

Similarly to an audio signal, a tactile signal also requires information indicating which channel vibrates which region.

Furthermore, when a tactile signal is assumed to be transmitted via the internet, wireless, or the like, the tactile signal is naturally considered as digitalized data. In this case, the digitalized tactile signal needs to be handled as data having a fixed time unit called a frame.

Thus, a data structure as illustrated in FIG. 8 is required.

In this example, a tactile signal (PCM data) of each region is stored into an individual frame. As illustrated in the drawing, the frame includes a region serving as a frame header and a region for storing real data of a tactile signal. The frame header stores at least information indicating a region of a tactile signal, as header information of the frame.

Moreover, frames of the respective regions are integrated and regarded as data in a unit called a stream. The stream is provided with a region serving as a stream header and a region storing the frame of each region. The stream header stores, as header information, information indicating the specification of a digitalized tactile signal (quantization bit length, sampling frequency, a data size of a stream, and the like), information regarding the number of frames included in the stream, and the like.

Such encoding of a tactile signal of each region is performed, and when the tactile signal is transmitted, as illustrated in the drawing, coded data having a configuration in which streams of the respective times are arranged on a time axis is handled.

By performing the above-described encoding, high convenience for the transmission and reproduction of tactile signals can be obtained.

Here, as described above, if the number of regions to which tactile signals are given is increased, a bit rate of a tactile signal proportionally increases, and large load is applied onto the system. In view of the foregoing, in the present embodiment, by differentiating a bit distribution of tactile signal of each region considering a tactile characteristic of each region, a bit rate obtainable in a case where tactile signals of the entire region are considered is reduced.

Here, for the sake of simplicity of description, a case where tactile presentation is performed to one point in a hand and one point in a foot of a human body will be considered. If a basic condition is set to the same condition as Formula [1], a total bit rate B (hand+foot) necessary in this case is obtained by the following formula [2].

$$B(\text{hand}+\text{foot})=12 \text{ bit/sample} \times 2000 \text{ sample/sec} \times 2=48 \text{ kbit/sec} \qquad [2]$$

As seen from the above description, ratios of brain regions that process tactile senses of the hand and the foot of the human are greatly different. While tactile characteristics (for example, sensitivities) of the hand and the foot are not accurately converted into numerical values at the level of multiple, it is obvious from the experience that the hand is superior to the foot from the aspect of tactile sensitivity. Thus, a conversion coefficient (W) of sensitivity (S-foot) of the foot that is based on the sensitivity (S-hand) of the hand is represented by the following formula [3].

$$S\text{-foot} = W \times S\text{-hand}(W<1.0) \quad [3]$$

Note that, originally, tactile sensitivity of the hand varies between fingers and palm, but for the sake of simplicity, regions of "hand" and "foot" are considered.

If the above-described conversion coefficient W is assumed to be W=0.25, for example, one bit corresponds to 6 dB (double). Thus, a quantization bit length necessary for a tactile signal of the foot becomes 10 bits with respect to 12 bits being a quantization bit length necessary for a tactile signal of the hand, and a total bit rate B (hand+foot) can be obtained as follows.

$$B(\text{hand}) = 12 \text{ bit/sample} \times 2000 \text{ sample/sec} = 24 \text{ kbit/sec} \quad [4]$$

$$B(\text{foot}) = 10 \text{ bit/sample} \times 2000 \text{ sample/sec} = 20 \text{ kbit/sec} \quad [5]$$

$$B(\text{hand+foot}) = 44 \text{ kbit/sec} \quad [6]$$

In the above-described example, a bit rate is reduced only by about 10% from [2], but if it is further assumed that the foot can perceive only ½ frequency of the hand, a total bit rate B(hand+foot) can be obtained as follows.

$$B(\text{hand}) = 12 \text{ bit/sample} \times 2000 \text{ sample/sec} = 24 \text{ kbit/sec} \quad [7]$$

$$B(\text{foot}) = 10 \text{ bit/sample} \times 1000 \text{ sample/sec} = 10 \text{ kbit/sec} \quad [8]$$

$$B(\text{hand+foot}) = 34 \text{ kbit/sec} \quad [9]$$

Therefore, bit rate can be reduced by about 30% from [2]

Another example of differentiating a sampling frequency and a quantization bit length between regions will be described below.

In this example, a case where tactile stimulation is applied to a hand, a face, and a foot will be considered.

In this case, if a sampling frequency and a quantization bit length similar to those of the hand are set also for the face and the foot, a total bit rate B(hand+face+foot) is represented as B(hand+face+foot)=72 kbit/sec [10].

Here, for example, the respective sensitivity coefficients of the face and the foot are set as follows.

$$S\text{-face} = W\text{-face} \times S\text{-hand}(W=0.5) \quad [11]$$

$$S\text{-foot} = W\text{-foot} \times S\text{-hand}(W<0.25) \quad [12]$$

That is, if a quantization bit length necessary for a tactile signal of the hand is set to 12 bits, a quantization bit length of the face becomes 11 bits, and a quantization bit length of the foot becomes 10 bits.

Furthermore, here, it is assumed that a frequency band in which tactile stimulation can be perceived varies depending on the regions of the hand, the face, and the foot.

Figure 9:
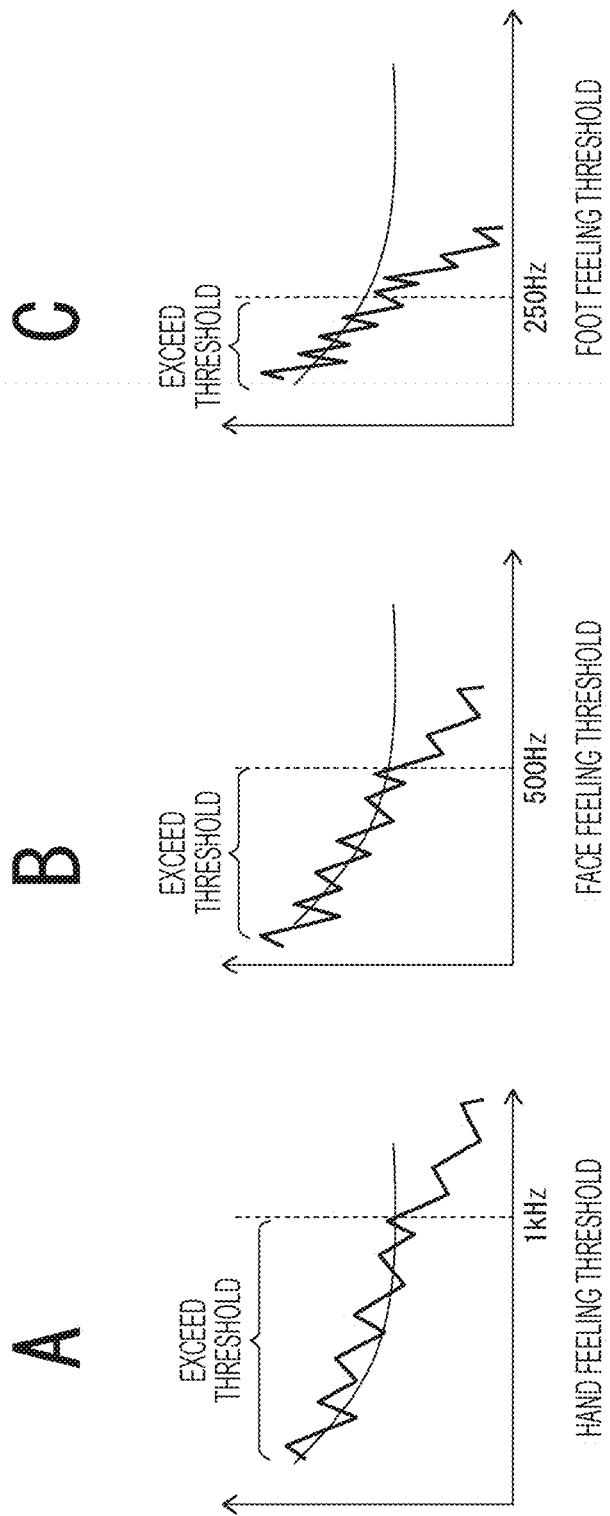
FIG. 9 is a diagram exemplifying a difference between regions in a frequency band in which tactile stimulation can be perceived.

Specifically, for example, as illustrated in FIG. 9, it is assumed that the hand can perceive only vibration in a frequency band up to 1 kHz (refer to FIG. 9A), the face can perceive only vibration in a frequency band up to 500 Hz (refer to FIG. 9B), and the foot can perceive only vibration in a frequency band up to 250 Hz (refer to FIG. 9C).

Under the above-described conditions, if a quantization bit length necessary for a tactile signal of the hand in this case is set to 12 bits, a total bit rate B(hand+face+foot) can be obtained as follows.

$$B(\text{hand}) = 12 \text{ bit/sample} \times 2000 \text{ sample/sec} = 24 \text{ kbit/sec} \quad [13]$$

$$B(\text{face}) = 11 \text{ bit/sample} \times 1000 \text{ sample/sec} = 11 \text{ kbit/sec} \quad [14]$$

$$B(\text{foot}) = 10 \text{ bit/sample} \times 500 \text{ sample/sec} = 5 \text{ kbit/sec} \quad [13]$$

$$B(\text{hand+face+foot}) = 40 \text{ kbit/sec} \quad [14]$$

Therefore, a total bit rate can be reduced by about 45% as compared with the case of [10].

As described above, FIG. 10 illustrates a structure example of coded data in a case where a data format of a tactile signal is differentiated for each region. Here, as an example, a data structure of a frame and a data structure of a stream that correspond to the case of Formula [9] is illustrated.

As illustrated in the drawing, the header of a frame of each region stores values indicating a quantization bit length and a sampling frequency of a tactile signal of the corresponding region. Therefore, even if a data format of a tactile signal varies depending on the region, a data format of a tactile signal stored in a frame on the decoding apparatus 3 side can be easily identified.

In the case of an audio signal being a one-dimensional signal similar to a tactile signal, even if the signal includes a plurality of frames (or channels), because all of these frames (or channels) generally have the same format, a quantization bit length and a sampling frequency are only required to be written into the header of the stream. In a case where a data format of a tactile signal is differentiated for each region as described above, because all frames need not have the same data format while the data format becomes more complicated as compared with the data format of an audio signal, efficiency is enhanced and advantageous from the aspect of a bit rate.

Here, in the above description, a sampling frequency and a quantization bit length are assumed to be statically defined, that is, a bit distribution of each region is assumed to be statically defined. Alternatively, a bit distribution of each region can also be dynamically changed in accordance with a temporal condition change, for example.

As a specific example, a case where a bit rate on a transmission path is temporarily restricted due to a certain factor, and a total bit rate of tactile signals of the regions do not fall within the restricted bit rate will be considered.

In this case, a sampling frequency and a quantization bit length of a specific region are restricted so as to fall within the restricted bit rate, and a bit distribution of the region is reduced. At this time, it is desirable that a region on which restriction is imposed is a region with low tactile sensitivity, that is, a face or a foot in the example described so far, for suppressing a reproducibility decline of a tactile sense.

Furthermore, on the other hand, even for a tactile signal of a region with high sensitivity, if the signal itself does not exist, that is, if a signal amplitude does not reach a perceivable amplitude, it can be said that necessity of transmission is low. Thus, in this manner, as for a tactile signal of a region with a small signal amplitude, a bit distribution can be reduced.

As an example, regions to which tactile stimulation is applied are assumed to include a hand, a face, and a foot. In this case, in the encoding apparatus 2, an amplitude value of a tactile signal of each region is monitored, and the presence or absence of a region in which a signal amplitude is small, specifically, a signal amplitude does not reach an amplitude value perceivable by a human is determined. The determination is performed for each frame in a stream, for example. Note that the determination as to whether or not a signal amplitude reaches an amplitude value perceivable by a human can be performed on the basis of the vibration detection threshold curve illustrated in FIG. 4.

A bit distribution is reduced for a region determined to be a region in which an amplitude value of a tactile signal does not reach a perceivable amplitude value, as a result of the determination. Specifically, a bit distribution is set to zero.

For example, in a case where regions determined to be a region in which an amplitude value does not reach a perceivable amplitude value include only a face and a foot, a bit distribution is represented by the following formulae.

$$B(\text{hand})=12 \text{ bit/sample} \times 2000 \text{ sample/sec}=24 \text{ kbit/sec} \quad [17]$$

$$B(\text{face})=0 \text{ kbit/sec} \quad [18]$$

$$B(\text{foot})=0 \text{ kbit/sec} \quad [19]$$

$$B(\text{hand+face+foot})=24 \text{ kbit/sec} \quad [20]$$

Alternatively, in contrast, in a case where regions determined to be a region in which an amplitude value does not reach a perceivable amplitude value include only a hand, a bit distribution is represented by the following formulae.

$$B(\text{hand})=0 \text{ kbit/sec} \quad [21]$$

$$B(\text{face})=11 \text{ bit/sample} \times 2000 \text{ sample/sec}=22 \text{ kbit/sec} \quad [22]$$

$$B(\text{foot})=10 \text{ bit/sample} \times 2000 \text{ sample/sec } 20 \text{ kbit/sec} \quad [23]$$

$$B(\text{hand+face+foot})=42 \text{ kbit/sec} \quad [24]$$

Note that, in Formula [22] and [23], the sampling frequencies of the face and the foot are the same as the sampling frequency of the hand, but sampling frequencies lower than the sampling frequencies can also be employed (refer to Formulae [14] and [15]).

By employing the above-described bit distribution, even under the restricted condition, a necessary tactile signal can be transmitted.

(Functional Configuration of Encoding Side)

Figure 11:
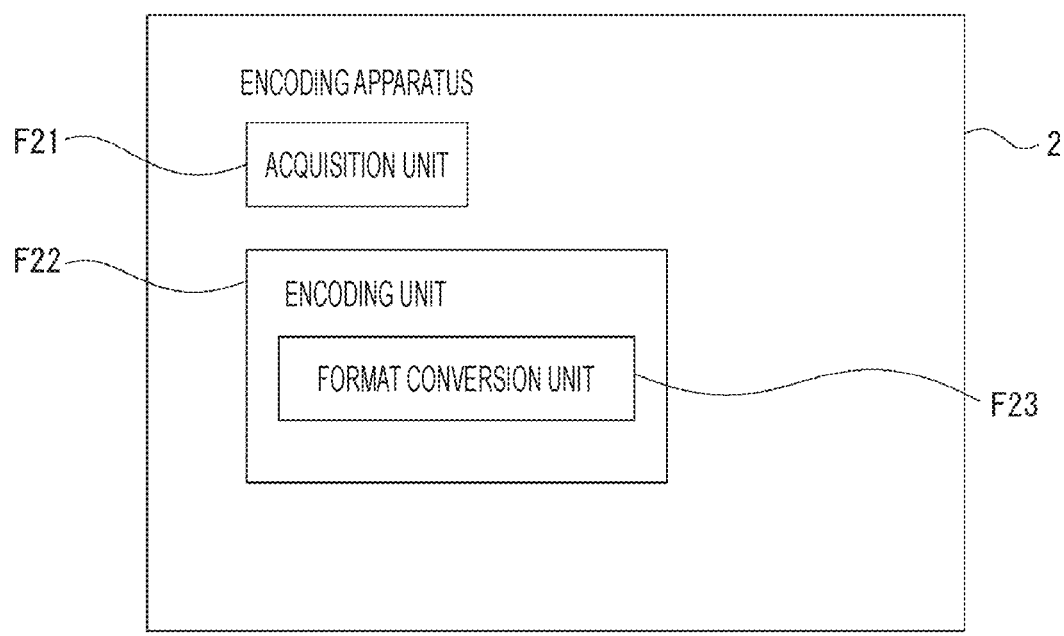
FIG. 11 is a functional block diagram illustrating a functional configuration of the encoding apparatus according to the first embodiment.

FIG. 11 is a functional block diagram illustrating a functional configuration of the encoding apparatus 2 for implementing the above-described encoding method.

As illustrated in the drawing, the encoding apparatus 2 includes functions as an acquisition unit F21 and an encoding unit F22. Furthermore, the encoding unit F22 includes a function as a format conversion unit F23.

The acquisition unit F21 acquires a tactile signal of each region of a human body. In this example, the amplifier 21 and the A/D converter 22 correspond to the acquisition unit F21.

The encoding unit F22 performs encoding of the tactile signal of each region that has been acquired by the acquisition unit F21 in such a manner that a data format becomes different between different regions of the human body.

The encoding unit F22 of this example performs encoding in such a manner as to vary a bit distribution for a region in accordance with tactile sensitivity, using the format conversion unit F23. Specifically, the encoding unit F22 performs encoding in such a manner as to reduce a bit distribution for a region with low tactile sensitivity. In other words, for example, as in Formulae [7] and [8] or Formulae [13], [14], and [15], a quantization bit length of a tactile signal of a region with low tactile sensitivity is shortened or a sampling frequency of the tactile signal is lowered.

Furthermore, the encoding unit F22 of this example reduces a bit distribution for a region with a small signal amplitude, using the format conversion unit F23. Specifically, for example, the encoding unit F22 shortens a quantization bit length of a tactile signal or lowers a sampling frequency of the tactile signal as for a region in which an amplitude value of the tactile signal does not reach a perceivable amplitude value, as in Formulae [7] and [8] or Formulae [13], [14], and [15], for example.

Alternatively, for example, in a case where there is a region in which an amplitude value of a tactile signal does not reach a perceivable amplitude value, a bit distribution is set to zero as for a tactile signal of the region as in Formulae [17], [18], and [19], or Formulae [21], [22], and [23].

Moreover, the encoding unit F22 of this example adds, for each region, index information indicating the type of a region, to a tactile signal. Specifically, as exemplified in FIG. 10, information indicating the type of a region is stored into a frame header of a tactile signal.

In this example, the above-described function as the encoding unit F22 is implemented by the encoding unit 24.

For differentiating a quantization bit length and a sampling frequency of a tactile signal for each region, for example, an A/D converter 22 having the same quantization bit length and the sampling frequency is used as each of the A/D converters 22, and the encoding unit 24 performs conversion processing of a quantization bit length and a sampling frequency of a tactile signal of a region requiring conversion, among A/D converted tactile signals.

Note that a function of differentiating a quantization bit length and a sampling frequency of a tactile signal for each region can be implemented by using A/D converters 22 having different quantization bit lengths and sampling frequencies as the A/D converters 22. In this case, each of the A/D converters 22 has a function of the encoding unit F22.

(Decoding Method)

The decoding apparatus 3 of the present embodiment performs reproduction of tactile signals obtained by encoding performed by the encoding apparatus 2, that is, tactile signals having different data formats between different regions of a human body, in compliance with a data format of each region.

Here, a tactile signal is a one-dimensional signal, and data handling thereof can be basically considered similarly to a voice signal. It is general that a quantization bit length and a sampling frequency of a voice signal are the same in each ch, and on the reproduction side, D/A converters 32 having the same specification can be used in each ch. On the other hand, in the present embodiment, because a quantization bit length and a sampling frequency vary depending on the ch, D/A converters 32 having different specifications between channels are assumed to be used. Therefore, there is a concern about the complication of the configuration of the decoding apparatus 3 and an accompanying cost increase.

Figure 12:
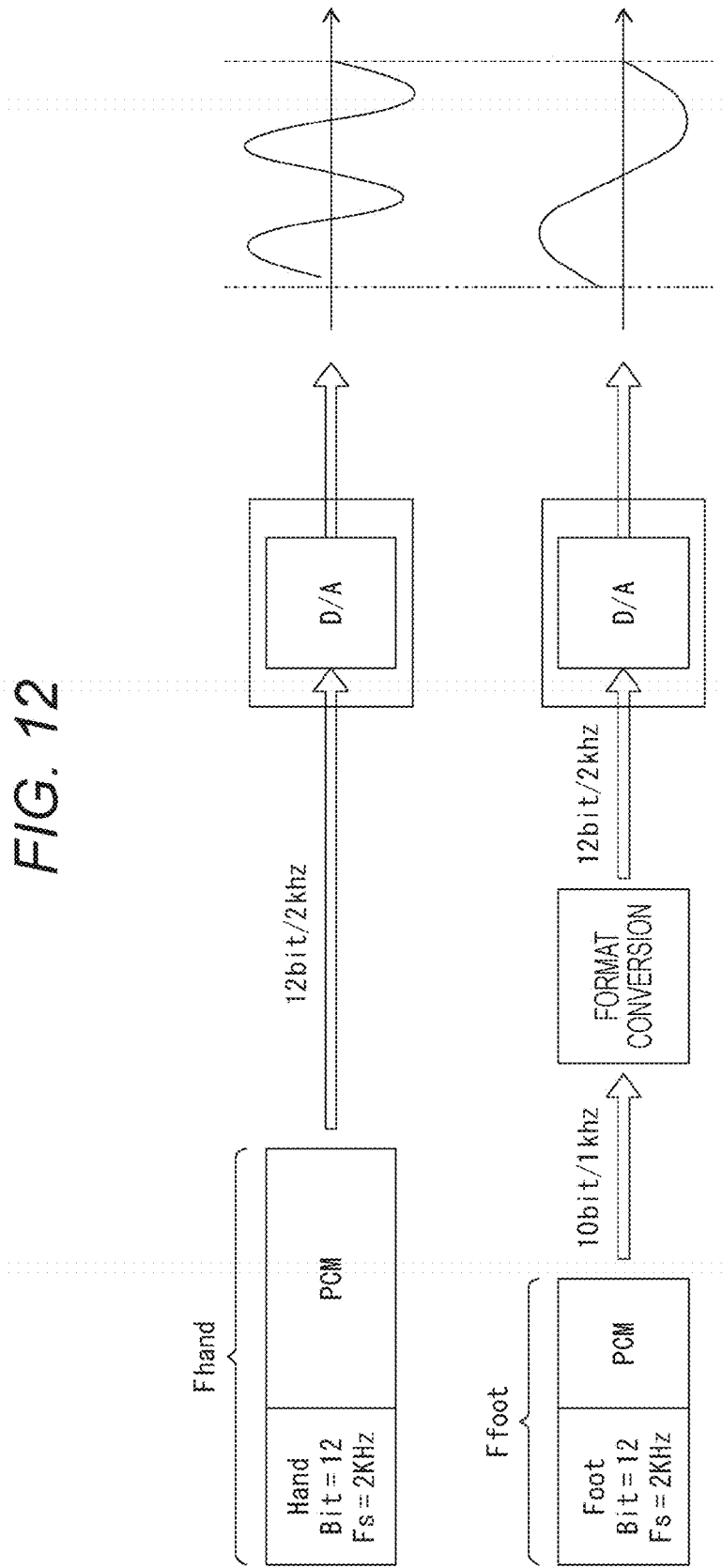
FIG. 12 is a diagram for describing an example of format conversion of a tactile signal.

In view of the foregoing, in this example, as illustrated in FIG. 12, when a tactile signal of each region is reproduced, format conversion processing is performed on a tactile signal of at least one region. In the example illustrated in FIG. 12, in a case where a quantization bit length of a tactile signal of a hand=12 bits and a sampling frequency=2 kHz are set while a quantization bit length of a tactile signal of a foot=10 bits and a sampling frequency=1 kHz are set, a case where format conversion is performed on the tactile signal of the foot for converting the format into the data format of the tactile signal of the hand is illustrated.

By performing such format conversion, data formats of tactile signals of the regions can be made the same, and D/A converters having the same specification can be used as the D/A converters 32.

At this time, for easily setting sampling frequencies to a fixed value in particular, on the encoding apparatus 2 side, it is desirable to set a ratio between sampling frequencies of regions to an integral multiple. For example, as in the example in FIG. 12, by setting 1000 samle/sec and 2000 sample/sec, the former can be changed to the latter by performing duple oversampling.

Figure 13:
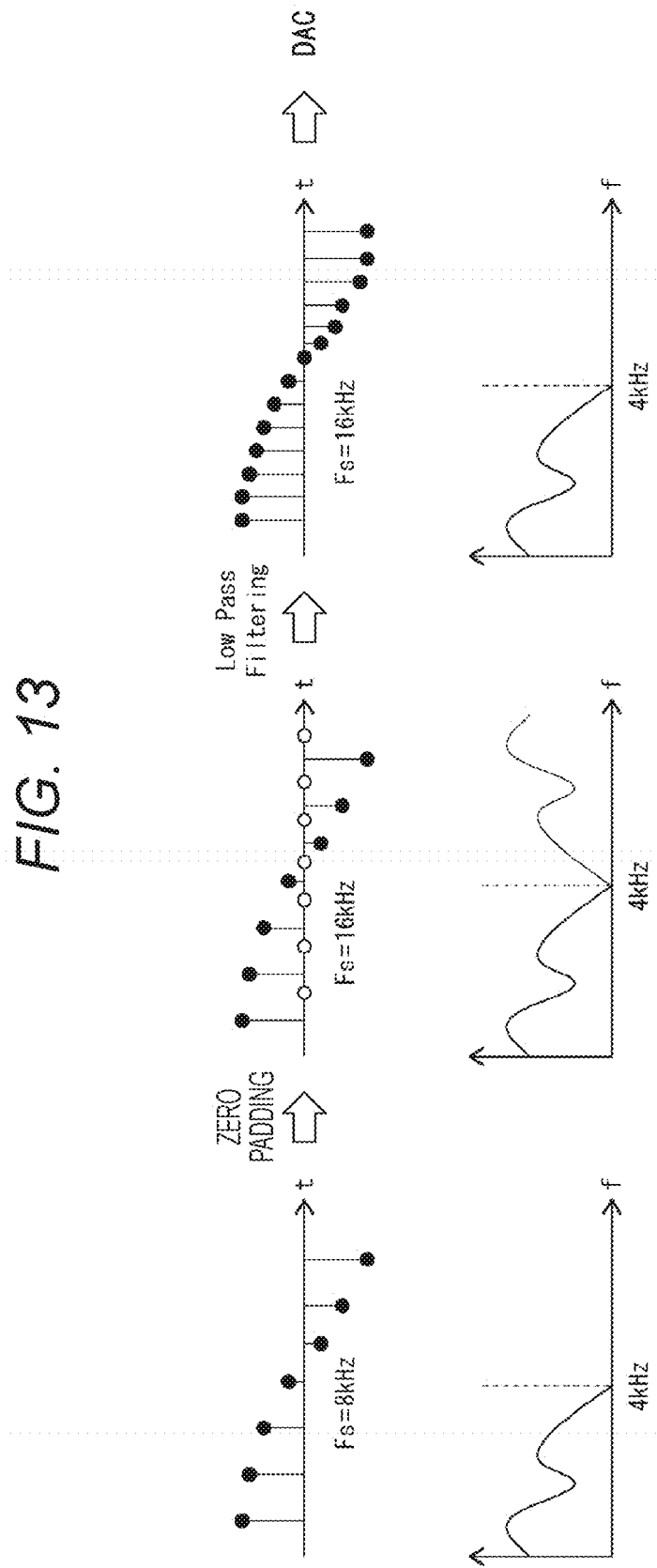
FIG. 13 is an explanatory diagram illustrating an example of aliasing attributed to oversampling and removal thereof.

Here, in a case where oversampling of a voice signal is performed, if oversampling from 8000 sample/sec to 16000 sample/sec is considered, aliasing components are generated at 4000 Hz to 8000 Hz at the reproduction frequency, and this is heard. Thus, a low pass filter (LPF) is essential. This is illustrated in FIG. 13.

However, in the case of a tactile signal, it is said that a range of a perceivable frequency is up to about 1 kHz (sampling frequency=2 kHz). Furthermore, originally, the reproduction range of the tactile presentation apparatus 6 is set to about the same range in many cases. Thus, unlike the case of a voice signal, the oversampling of a tactile signal does not always require the provision of an LPF.

For example, because the D/A converter 32 is often used for the purpose of voice (signal bandwidth of 4 kHz, that is, sampling frequency=about 8 kHz is lower limit), the D/A converter 32 supporting a sampling frequency of 2 kHz is not common. Thus, even if the specification of a tactile signal of 2 kHz is used for higher efficiency, a general D/A converter 32 cannot reproduce the tactile signal as-is.

Thus, for making a general D/A converter 32 usable, oversampling processing for converting a tactile signal of each region into a predetermined sampling frequency such as a sampling frequency of 8 kHz or more, for example, is performed.

Figure 14:
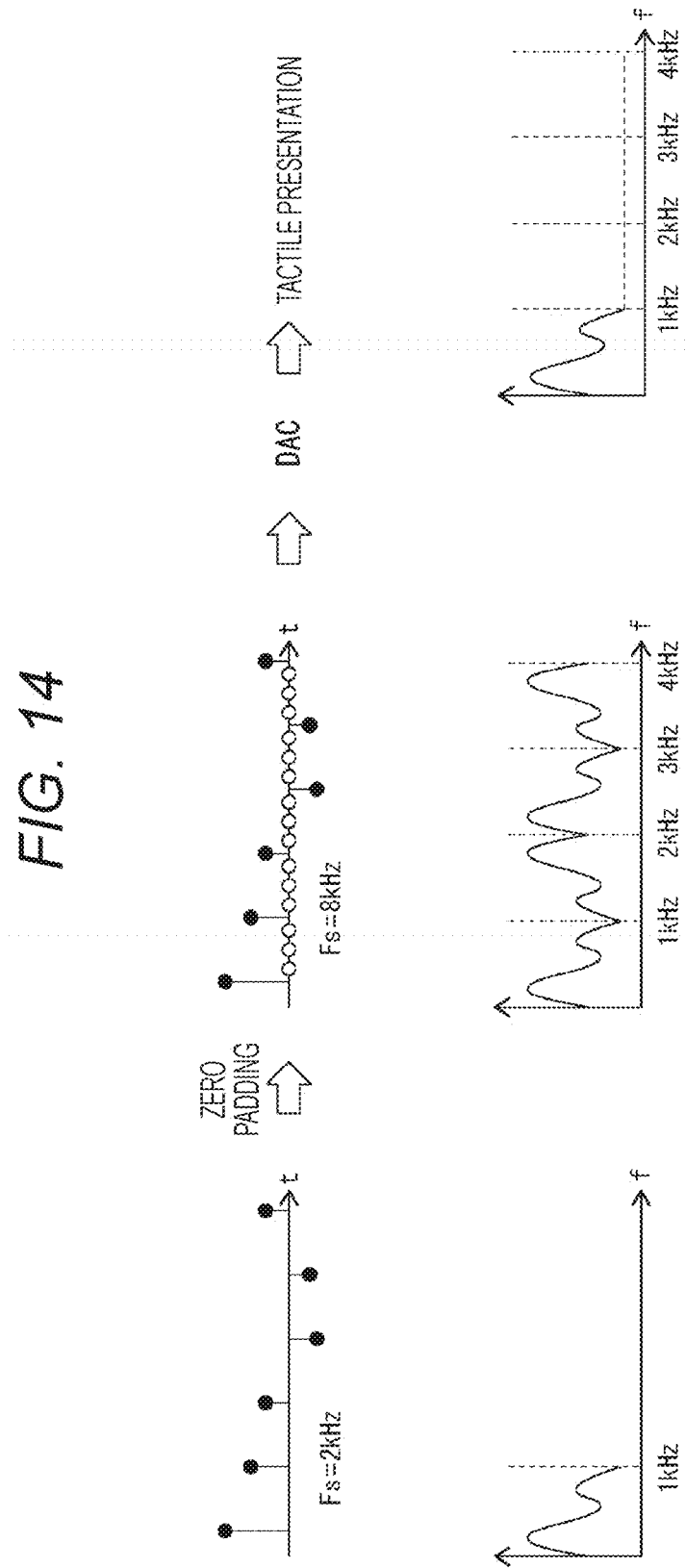
FIG. 14 is an explanatory diagram oversampling of a tactile signal.

For example, in a case where oversampling processing for converting a sampling frequency from 2 kHz to 8 kHz is performed by simple zero value interpolation, aliasing is generated at a signal bandwidth of 1 kHz to 4 kHz, but as described above, because this frequency band is a region with extremely low tactile sensitivity, an LPF can be omitted without problem. Furthermore, if the alias cannot be reproduced by the tactile presentation apparatus 6, an LPF can be omitted as well. This image is illustrated in FIG. 14.

(Functional Configuration of Decoding Side)

Figure 15:
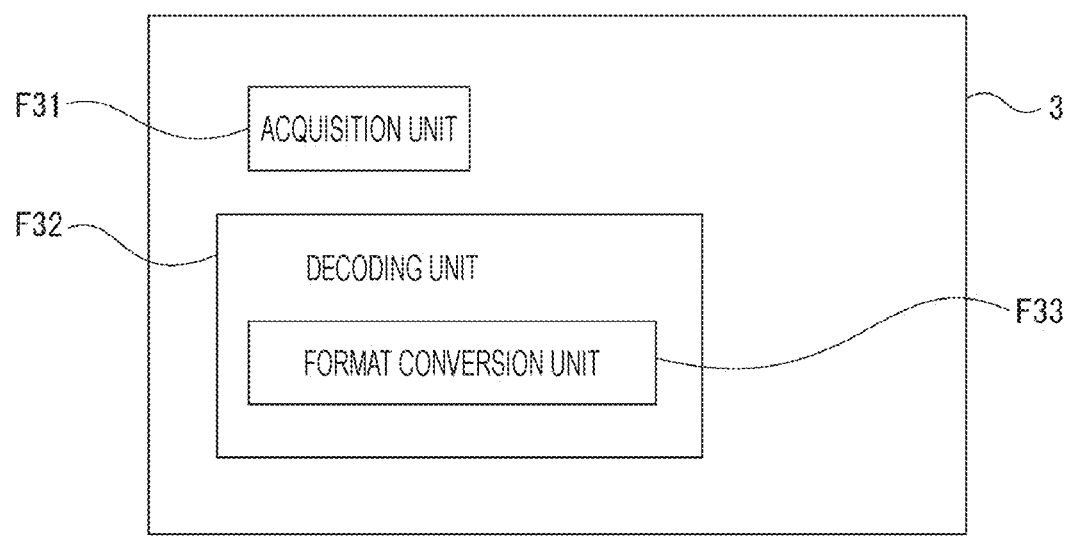
FIG. 15 is a functional block diagram illustrating a functional configuration of the decoding apparatus according to the first embodiment.

FIG. 15 is a functional block diagram illustrating a functional configuration of the decoding apparatus 3.

As illustrated in the drawing, the decoding apparatus 3 includes functions as an acquisition unit F31 and a decoding unit F32. Furthermore, the decoding unit F32 includes a function as a format conversion unit F33.

The acquisition unit F31 acquires tactile signals having different data formats between different regions of a human body. A part that acquires a tactile signal of each region that has been transmitted by the encoding apparatus 2 corresponds to the acquisition unit F31 in this example. In this example, the communication unit 37 corresponds to the acquisition unit F31.

The acquisition unit F31 of this example acquires tactile signals having data formats of the respective regions defined in such a manner as to vary a bit distribution for the regions in accordance with tactile sensitivity. Specifically, the acquisition unit F31 acquires a tactile signal in which a data format of each region is defined in such a manner as to vary a bit distribution for a region with low tactile sensitivity. In other words, for example, as in Formulae [7] and [8] or Formulae [13], [14], and [15], for a region with low tactile sensitivity, a tactile signal with a shortened quantization bit length and a lowered sampling frequency is acquired.

Furthermore, the acquisition unit F31 of this example acquires, as a tactile signal, as a tactile signal of which a bit distribution is increased for a region with a large signal amplitude. Specifically, for example, on the basis of the magnitude of a signal amplitude that is based on whether or not an amplitude value of a tactile signal reaches a perceivable amplitude value, for example, as in Formulae [7] and [8] or Formulae [13], [14], and [15], a tactile signal of each region including a tactile signal with a shortened quantization bit length and a lowered sampling frequency is acquired.

Alternatively, for example, in accordance with an amplitude value of a tactile signal not reaching a perceivable amplitude value, as in Formulae [17], [18], and [19] or Formulae [21], [22], and [23], a tactile signal of a region in which a bit distribution is not set to zero in a case where a bit distribution of a partial region is set to zero is acquired.

Moreover, the acquisition unit F31 of this example acquires, for each region, a tactile signal to which index information indicating the type of the region is added. Specifically, as exemplified in FIG. 10, a tactile signal in which information indicating the type of a region is stored in a frame header is acquired.

Furthermore, the decoding unit F32 decodes the tactile signal acquired by the acquisition unit F31. In the decoding apparatus 3 of this example, a configuration for implementing the decoding unit F32 is a part at least including the decoding unit 34.

The decoding unit F32 of this example converts at least either a quantization bit length or a sampling frequency of at least any tactile signal of tactile signals of the respective regions, using the format conversion unit F33. Note that, in a case where only a sampling frequency is to be converted for the sake of the specification of the D/A converter 32, the conversion of a quantization bit length is unnecessary. In contrast, in a case where only a quantization bit length is to be converted, conversion of a sampling frequency is unnecessary.

The function as the format conversion unit F33 is implemented by the decoding unit 34.

Note that, as described above, a quantization bit length and a sampling frequency of a tactile signal sometimes change with time on the basis of a determination result of the magnitude of a signal amplitude and the like. In this example, because information regarding a quantization bit length and a sampling frequency is stored into a frame header, even if a quantization bit length and a sampling frequency change with time in this manner, their values are indicated in the frame header.

The format conversion unit F33 changes, for a tactile signal of each region, processing content of format conversion, specifically, processing content of oversampling processing and the like on the basis of information regarding a quantization bit length and a sampling frequency that is stored in the frame header.

Therefore, even in a case where a quantization bit length and a sampling frequency of a tactile signal change with time, D/A conversion of a tactile signal can be appropriately performed.

Furthermore, the decoding unit F32 of this example performs decoding of a tactile signal of each region on the basis of index information indicating the type of a region that is added to the tactile signal. Specifically, the decoding unit F32 (the decoding unit 34) identifies a region of a tactile signal on the basis of information indicating the type of the region that is stored in a frame header, and performs processing suitable for the region. For example, the decoding unit F32 performs processing of outputting a tactile signal to an output ch corresponding to the region, and the like.

Note that the above description has been given of an example in which reproduction of a tactile sense is performed in approximate real time, but a system that stores a tactile signal encoded by the above-described method, into a predetermined storage medium, reads out the tactile signal as necessary, and reproduces the tactile signal can also be constructed. In this case, coded data can be stored into a storage medium as a data file in a predetermined format. Furthermore, the user can perform processing and editing on the data file, and tagging and the like of additional information that are accompanied by the processing and editing may be performed.

The above-described storage medium may be, for example, a removable media such as an optical disc or a memory card. In this case, for example, a configuration in which the decoding apparatus 3 such as a personal computer reads out a data file of a tactile signal that is stored in the removable media, and reproduces the tactile signal, and the like can be considered.

Furthermore, as another example, a configuration in which the decoding apparatus 3 serving as a client terminal acquires, via the network 4, a data file of a tactile signal that is stored in a storage server of a cloud, and reproduces the tactile signal can also be considered.

Furthermore, in the above description, a case where data formats of tactile signals are differentiated for each region (that is, data formats of tactile signals of all regions are different) has been exemplified, but a data format may be the same between partial regions. In other words, data formats of tactile signals are only required to be different at least between different regions.

Here, the functions as the encoding unit F22 and the decoding unit F32 that have been described with reference to FIGS. 11 and 15 can be implemented as software processing performed by a CPU and the like. The software processing is executed on the basis of a program, and the program is stored in a storage device from which programs can be read out by a computer device such as the CPU.

1-5. Conclusion of First Embodiment

As described above, the encoding apparatus (encoding apparatus 2) according to the first embodiment includes the encoding unit (encoding unit F22) that encodes tactile signals using different data formats between different regions of a human body.

Therefore, for example, a data amount reduction of a tactile signal can be performed considering a difference in tactile characteristic between regions of a human body, by reducing a data distribution of a tactile signal for a region with low tactile sensitivity using a difference in tactile sensitivity between regions of a human body, and the like.

Thus, a system related to tactile reproduction can be made more efficient by achieving a data amount reduction of a tactile signal while ensuring reproducibility of a tactile sense.

Furthermore, in the encoding apparatus according to the first embodiment, the encoding unit encodes tactile signals using data formats different between regions with different tactile characteristics of a human body.

Therefore, a data amount reduction of a tactile signal can be performed using a difference in tactile sensitivity and the like between regions of a human body.

Thus, a system related to tactile reproduction can be made more efficient by achieving a data amount reduction of a tactile signal while ensuring reproducibility of a tactile sense.

Moreover, in the encoding apparatus according to the first embodiment, the encoding unit encodes tactile signals in such a manner as to vary a bit distribution for a region in accordance with tactile sensitivity.

Therefore, a data amount reduction of a tactile signal can be performed considering a difference in tactile characteristic between regions.

Thus, a system related to tactile reproduction can be made more efficient by achieving a data amount reduction of a tactile signal while ensuring reproducibility of a tactile sense.

Moreover, furthermore, in the encoding apparatus according to the first embodiment, the encoding unit encodes tactile signals in such a manner that quantization bit lengths become different between different regions.

Therefore, a data amount reduction of a tactile signal can be achieved by shortening a quantization bit length for a region with low tactile sensitivity (low sensitivity to the amplitude of tactile stimulation).

Thus, a system related to tactile reproduction can be made more efficient by achieving a data amount reduction of a tactile signal while ensuring reproducibility of a tactile sense.

Furthermore, in the encoding apparatus according to the first embodiment, the encoding unit encodes tactile signals in such a manner that sampling frequencies become different between different regions.

Therefore, a data amount reduction of a tactile signal can be achieved by lowering a sampling frequency for a region with low tactile sensitivity (low sensitivity to the frequency of tactile stimulation).

Thus, a system related to tactile reproduction can be made more efficient by achieving a data amount reduction of a tactile signal while ensuring reproducibility of a tactile sense.

Moreover, in the encoding apparatus according to the first embodiment, the encoding unit includes the format conversion unit (format conversion unit F23) that converts at least either a quantization bit length or a sampling frequency of at least any tactile signal of tactile signals of the respective regions.

By performing encoding in such a manner that at least either a quantization bit length or a sampling frequency varies in this manner, a data amount reduction can be achieved.

Moreover, furthermore, in the encoding apparatus according to the first embodiment, the encoding unit performs encoding in such a manner as to increase a bit distribution for a region in which a signal amplitude of a tactile signal is large.

Therefore, for example, for a tactile signal of a region in which a signal amplitude is small such as a signal amplitude not reaching a perceivable amplitude, that is to say, a region in which tactile stimulation is estimated to be difficult to be perceived from the aspect of the magnitude of a signal amplitude, a bit distribution is reduced including non-transmission of a signal, for example.

Thus, because a data amount reduction of a tactile signal is performed considering a difference in tactile characteristic between regions, a system related to tactile reproduction can be made more efficient by achieving a data amount reduction of a tactile signal while ensuring reproducibility of a tactile sense.

Furthermore, in the encoding apparatus according to the first embodiment, the encoding unit performs encoding of adding index information indicating the type of a region, to a tactile signal.

Therefore, easiness and accuracy of the identification of a region of a tactile signal are enhanced, and simplification of the configuration of the decoding apparatus, cost reduction, and accuracy improvement of tactile reproduction of each region can be achieved.

Furthermore, the encoding method according to the first embodiment is an encoding method of encoding tactile signals using different data formats between different regions of a human body.

According to such an encoding method, functions and effects similar to the above-described encoding apparatus according to the first embodiment can be obtained.

Moreover, a program on an encoding side according to the first embodiment is a program for causing an information processing apparatus to implement an encoding function of encoding tactile signals using different data formats between different regions of a human body.

According to such a program on the encoding side according to the first embodiment, the above-described encoding apparatus according to the first embodiment can be implemented.

Furthermore, the decoding apparatus (decoding apparatus 3) according to the first embodiment includes the decoding unit (decoding unit F32) that decodes encoded tactile signals using different data formats between different regions of a human body.

Therefore, for example, a data amount reduction of a tactile signal can be performed considering a difference in tactile characteristic between regions of a human body, by reducing a data distribution of a tactile signal for a region with low tactile sensitivity using a difference in tactile sensitivity between regions of a human body, and the like.

Thus, a system related to tactile reproduction can be made more efficient by achieving a data amount reduction of a tactile signal while ensuring reproducibility of a tactile sense.

Furthermore, in the decoding apparatus according to the first embodiment, the decoding unit decodes tactile signals having data formats different between regions with different tactile characteristics of a human body.

Therefore, a data amount reduction of a tactile signal can be performed using a difference in tactile sensitivity and the like between regions of a human body.

Thus, a system related to tactile reproduction can be made more efficient by achieving a data amount reduction of a tactile signal while ensuring reproducibility of a tactile sense.

Moreover, in the decoding apparatus according to the first embodiment, the decoding unit decodes tactile signals having data formats of the respective regions defined in such a manner as to vary a bit distribution for the regions in accordance with tactile sensitivity.

Therefore, a data amount reduction of a tactile signal can be performed considering a difference in tactile characteristic between regions.

Thus, a system related to tactile reproduction can be made more efficient by achieving a data amount reduction of a tactile signal while ensuring reproducibility of a tactile sense.

Moreover, furthermore, in the decoding apparatus according to the first embodiment, the decoding unit decodes tactile signals having different quantization bit lengths between different regions.

Therefore, a data amount reduction of a tactile signal can be achieved by shortening a quantization bit length for a region with low tactile sensitivity (low sensitivity to the amplitude of tactile stimulation).

Thus, a system related to tactile reproduction can be made more efficient by achieving a data amount reduction of a tactile signal while ensuring reproducibility of a tactile sense.

Furthermore, in the decoding apparatus according to the first embodiment, the decoding unit decodes tactile signals having different sampling frequencies between different regions.

Therefore, a data amount reduction of a tactile signal can be achieved by lowering a sampling frequency for a region with low tactile sensitivity (low sensitivity to the frequency of tactile stimulation).

Thus, a system related to tactile reproduction can be made more efficient by achieving a data amount reduction of a tactile signal while ensuring reproducibility of a tactile sense.

Moreover, in the decoding apparatus according to the first embodiment, the decoding unit includes the format conversion unit (format conversion unit F33) that inputs tactile signals being different in at least either a quantization bit length or a sampling frequency between the different regions, and converts at least either a quantization bit length or a sampling frequency of at least any tactile signal of tactile signals of the respective regions.

Therefore, the need for providing a plurality of types of D/A converters that perform D/A conversion of tactile signals, in accordance with a difference in a quantization bit length or a sampling frequency between regions is eliminated.

Thus, the simplification of the configuration of the decoding apparatus and cost reduction can be achieved.

Moreover, furthermore, in the decoding apparatus according to the first embodiment, the decoding unit decodes, as a tactile signal, a tactile signal of which a bit distribution for a region with a large signal amplitude is increased.

Therefore, for example, for a tactile signal of a region in which a signal amplitude is small such as a signal amplitude not reaching a perceivable amplitude, that is to say, a region in which tactile stimulation is estimated to be difficult to be perceived from the aspect of the magnitude of a signal amplitude, a bit distribution is reduced including non-transmission of a signal, for example.

Thus, because a data amount reduction of a tactile signal is performed considering a difference in tactile characteristic between regions, a system related to tactile reproduction can be made more efficient by achieving a data amount reduction of a tactile signal while ensuring reproducibility of a tactile sense.

Furthermore, in the decoding apparatus according to the first embodiment, the decoding unit inputs a tactile signal to which index information indicating the type of a region is added, and performs decoding of tactile signals of the respective regions on the basis of the index information.

Therefore, easiness and accuracy of the identification of a region of a tactile signal are enhanced, and simplification of the configuration of the decoding apparatus, cost reduction, and accuracy improvement of tactile reproduction of each region can be achieved.

Furthermore, the decoding method according to the first embodiment is a decoding method of decoding tactile signals encoded using different data formats between different regions of a human body.

Also according to such a decoding method according to the first embodiment, functions and effects that are similar to those of the above-described decoding apparatus according to the first embodiment can be obtained.

Furthermore, a program on a decoding side according to the first embodiment is a program for causing an information processing apparatus to implement a decoding function of decoding tactile signals encoded using different data formats between different regions of a human body.

According to such a program, the above-described decoding apparatus according to the first embodiment can be implemented.

2. Second Embodiment

2-1. Overview of Tactile Reproduction System

Subsequently, the second embodiment will be described.

The second embodiment takes measures against a transmission delay of a tactile signal.

Figure 16:
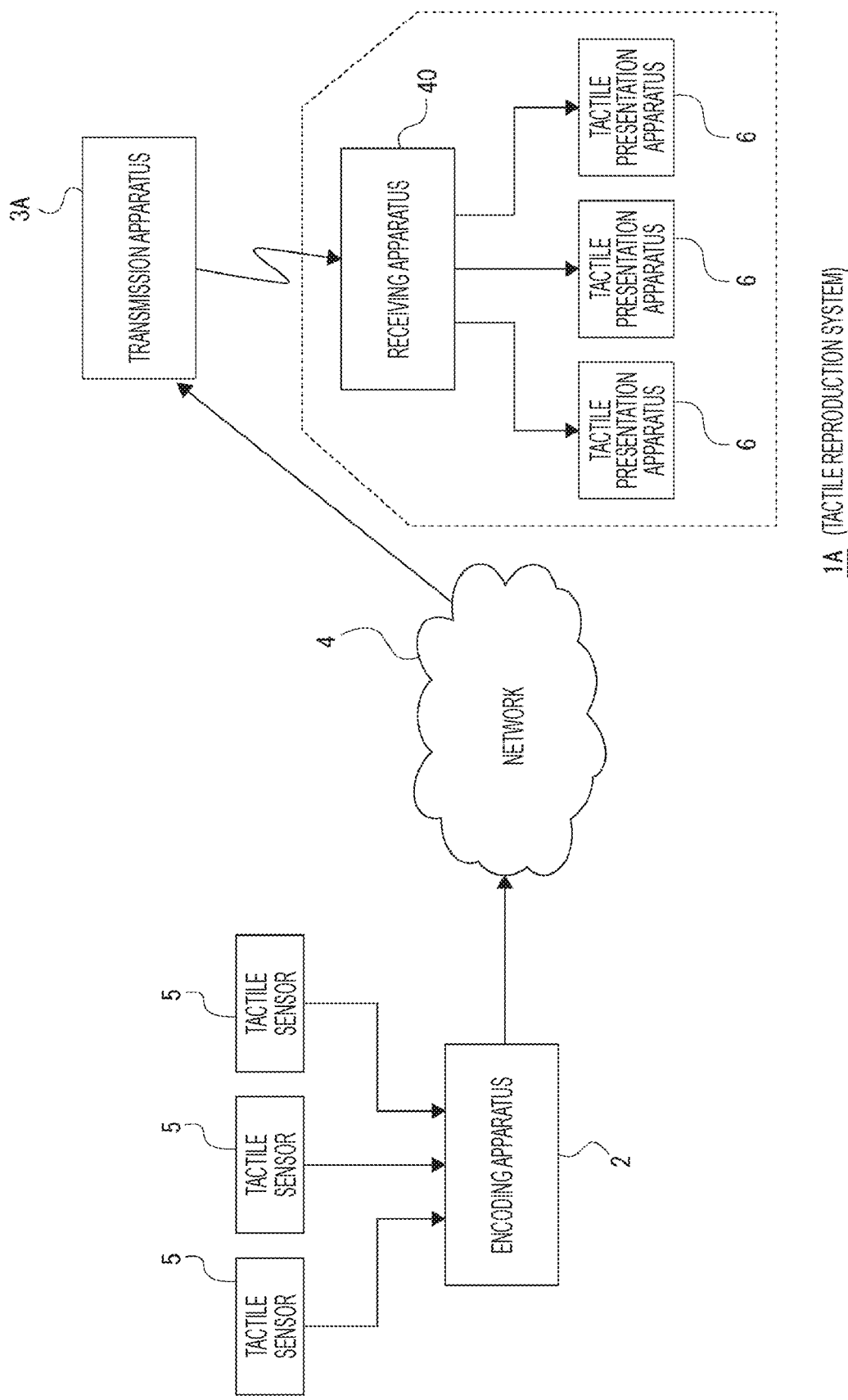
FIG. 16 is a diagram illustrating a configuration example of a tactile reproduction system according to a second embodiment.

FIG. 16 illustrates a configuration example of a tactile reproduction system 1A according to the second embodiment.

Note that, in the following description, parts similar to already-described parts are assigned the same reference numerals, and the description will be omitted.

In FIG. 16, the tactile reproduction system 1A is different from the tactile reproduction system 1 according to the first embodiment in that a transmission apparatus 3A is provided in place of the decoding apparatus 3 and a receiving apparatus 40 is provided.

In the tactile reproduction system 1A, each of the tactile presentation apparatuses 6 attached to a recipient is not connected to the transmission apparatus 3A in a wired manner, and the transmission of tactile signals from the transmission apparatus 3A to the tactile presentation apparatuses 6 is performed via wireless communication. The receiving apparatus 40 functions as an apparatus that receives tactile signals transmitted by the transmission apparatus 3A by wireless communication, and transmits the tactile signals to the tactile presentation apparatuses 6. In this example, each of the tactile presentation apparatuses 6 is connected to the receiving apparatus 40 in a wired manner, and a portion in the drawing that is surrounded by a broken line, that is to say, the receiving apparatus 40 and the tactile presentation apparatuses 6 are assumed to be a part attached to a recipient.

For example, as exemplified in the first embodiment, in a case where the decoding apparatus 3 and each of the tactile presentation apparatuses 6 are connected in a wired manner, if the size of the decoding apparatus 3 is large, the recipient to which the tactile presentation apparatuses 6 are attached might feel bothersome. The bothersome feeling is expected to increase as the number of regions to which tactile stimulation is applied increases.

By the above-described configuration of the tactile reproduction system 1A, it becomes possible to arrange the receiving apparatus 40 having a smaller size than the decoding apparatus 3, and prevent the recipient from feeling bothersome as described above.

2-2. Configuration of Transmission Apparatus

Figure 17:
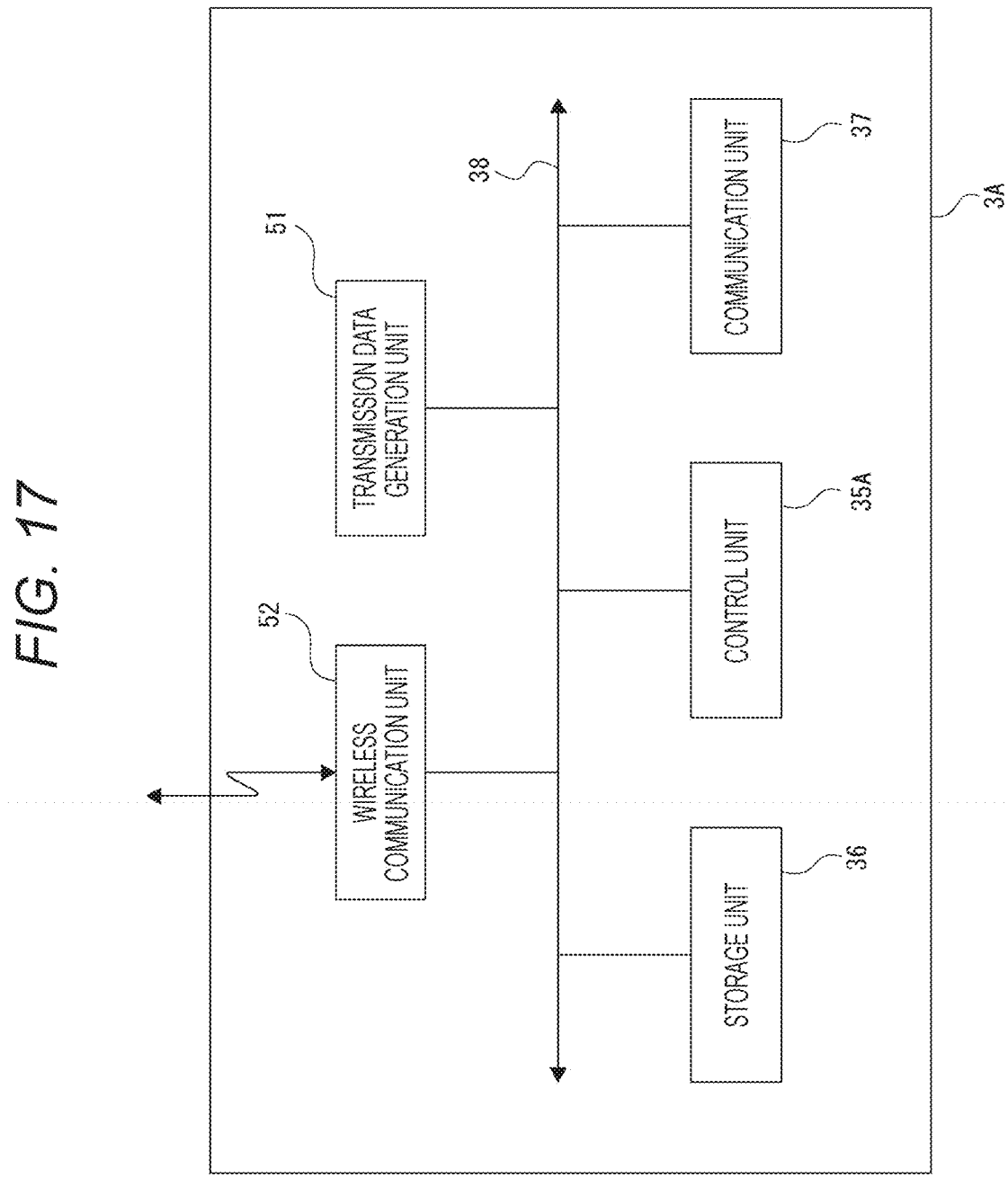
FIG. 17 is a diagram illustrating an inner configuration example of a transmission apparatus according to the second embodiment.

FIG. 17 illustrates an inner configuration example of the transmission apparatus 3A.

The transmission apparatus 3A is different from the decoding apparatus 3 illustrated in FIG. 3 in that the amplifier 31, the D/A converter 32, the postprocessing unit 33, and the decoding unit 34 are not provided, a transmission data generation unit 51 and a wireless communication unit 52 are provided, and a control unit 35A is provided in place of the control unit 35.

As illustrated in the drawing, the transmission data generation unit 51, the wireless communication unit 52, the control unit 35A, the storage unit 36, and the communication unit 37 are connected via the bus 38 and enabled to perform data communication with each other.

The transmission data generation unit 51 performs predetermined encoding on coded data of a tactile signal from the encoding apparatus 2 that is obtained via the communication unit 37 through the network 4, and generates coded data to be transmitted to the receiving apparatus 40.

Note that processing to be performed by the transmission data generation unit 51 of this example will be described later.

The wireless communication unit 52 performs near field communication using a predetermined communication method such as Bluetooth (registered trademark), for example.

The control unit 35A includes a microcomputer, for example, and controls the entire transmission apparatus 3A. In particular, the control unit 35A performs output control of coded data from the communication unit 37 to the transmission data generation unit 51, and output control of coded data generated by the transmission data generation unit 51, to the wireless communication unit 52.

Therefore, a tactile signal of each region can be transmitted to an external device via the wireless communication unit 52.

Note that, in the second embodiment, data formats of tactile signals of the respective regions may be different between different regions as described in the first embodiment, or may be the same among all the regions.

2-3. Configuration of Receiving Apparatus

Figure 18:
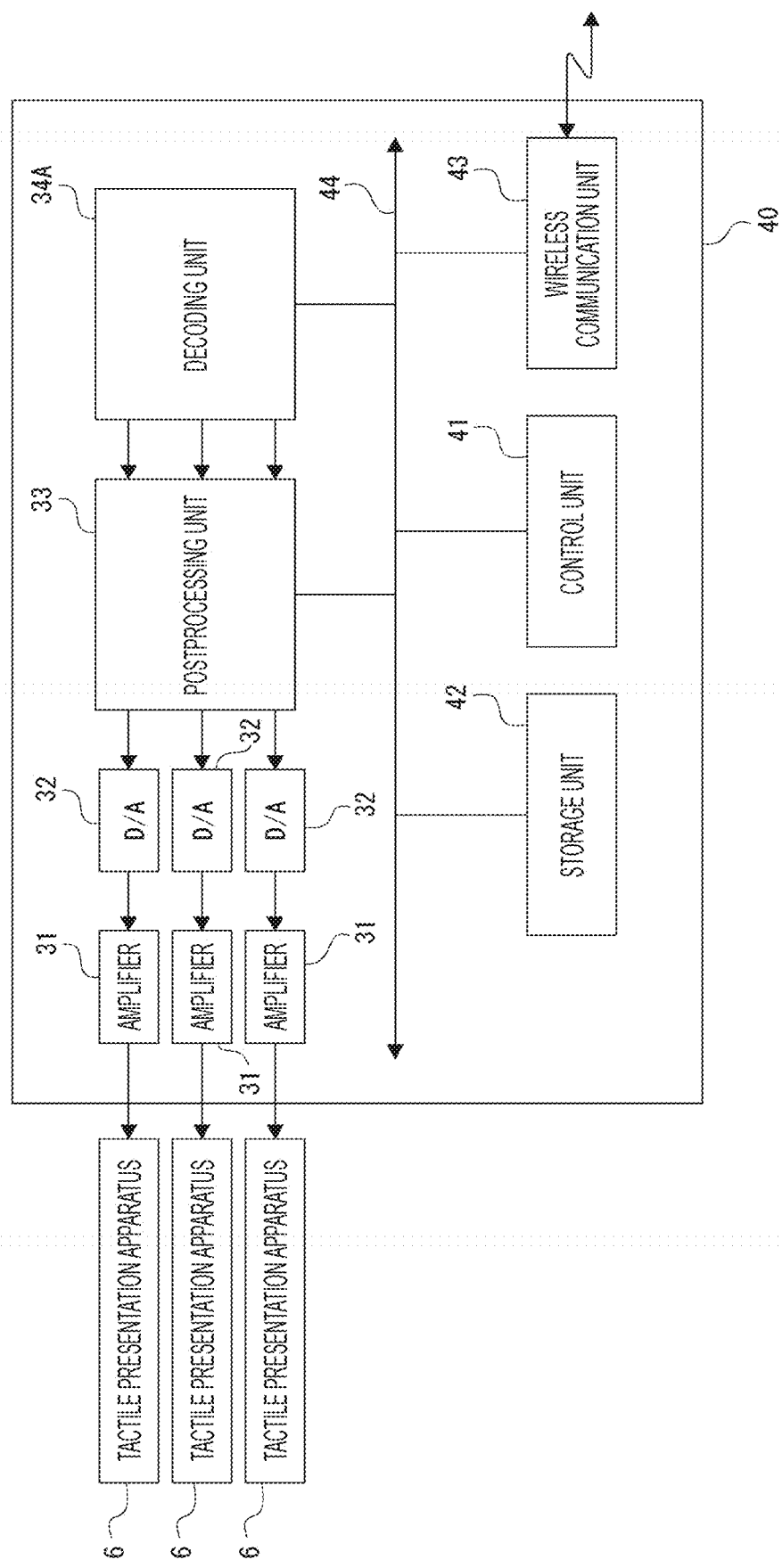
FIG. 18 is a diagram for describing an inner configuration example of a receiving apparatus according to a second embodiment.

FIG. 18 is a diagram for describing an inner configuration example of the receiving apparatus 40, and illustrates the tactile presentation apparatuses 6 together with the inner configuration example of the receiving apparatus 40.

As illustrated in the drawing, the receiving apparatus 40 includes an amplifier 31, a D/A converter 32, a postprocessing unit 33, and a decoding unit 34A, and includes a control unit 41, a storage unit 42, a wireless communication unit 43, and a bus 44. The postprocessing unit 33, the decoding unit 34A, the control unit 41, the storage unit 42, and the wireless communication unit 43 are connected via the bus 44 and enabled to perform data communication with each other.

The wireless communication unit 43 performs near field communication using a method that can perform communication with the wireless communication unit 52 in the transmission apparatus 3A, such as Bluetooth, for example. Coded data transmitted from the transmission apparatus 3A is received by the wireless communication unit 43.

The control unit 41 includes a microcomputer, for example, and controls the entire receiving apparatus 40.

The storage unit 42 is assumed to be a storage device similar to the storage unit 26, the storage unit 36, and the like, for example, and is used for the storage of various types of data to be used by the control unit 40 and the like.

The decoding unit 34A performs processing similar to the decoding unit 34 described in the first embodiment, on coded data input via the wireless communication unit 43. More specifically, the decoding unit 34A performs processing such as format conversion on a tactile signal of a necessary region, in response to a case where data formats of tactile signals are different between regions. Furthermore, the decoding unit 34A performs processing for taking measures against a transmission delay, on input coded data. The processing will be described later.

2-4. Tactile Reproduction Method According to Second Embodiment

Here, irrespective of wired or wireless, if data transmission is performed in a certain section, data loss occurs in some cases. The data loss is checked and when there is loss, the loss can be compensated for by retransmitting data, but extra data transmission is generated. Thus, an increase in effective bit rate and a transmission delay occur.

When wireless transmission using Bluetooth is considered as a specific example, the influence of Wi-Fi (registered trademark) that uses the same conveyance frequency is received. Because Bluetooth has lower radio field intensity than Wi-Fi, it can be said that Bluetooth is influenced especially easily. At the time of transmission, coded data is transmitted as data in a predetermined transmission unit called packet. In the above-described state, packet loss frequently occurs, and in the transmission of voice signals using an advanced audio distribution profile (A2DP) of Bluetooth, for example, a large stream buffer is prepared on a receiving side for retransmitting a packet in a case where packet loss occurs. By starting reproduction after a fixed stream is accumulated in the stream buffer, sound breakup is prevented.

However, an accumulation amount of coded data is equivalent to a delay amount, and if the accumulation amount becomes too large, a problem occurs. For example, in a case where corresponding voice is heard while viewing a video on a display, lip-sync becomes out of time, which leads to a large problem.

The transmission of tactile signals has a problem similar to the above-described case of voice signals.

For example, in a case where there is a video in which a bat of baseball is swung and tactile stimulation is desired to be applied to a recipient at the timing at which the bat strikes a ball, if the capacity of the stream buffer is large or retransmission is repeated due the occurrence of packet loss, a visual sense and a tactile sense become obviously unsynchronized, and the recipient might feel large strangeness.

In this manner, if synchronization between a tactile sense and another feeling is considered, it is demanded to eliminate the retransmission of a packet as far as possible and make a stream buffer on the receiving side as far as possible. For achieving this, it is effective to employ a data structure in which loss of part of a packet does not lead to a large problem. Specifically, as described above, because a human has a difference in tactile sensitivity between regions, a data structure that considers the difference is employed.

Figure 10:
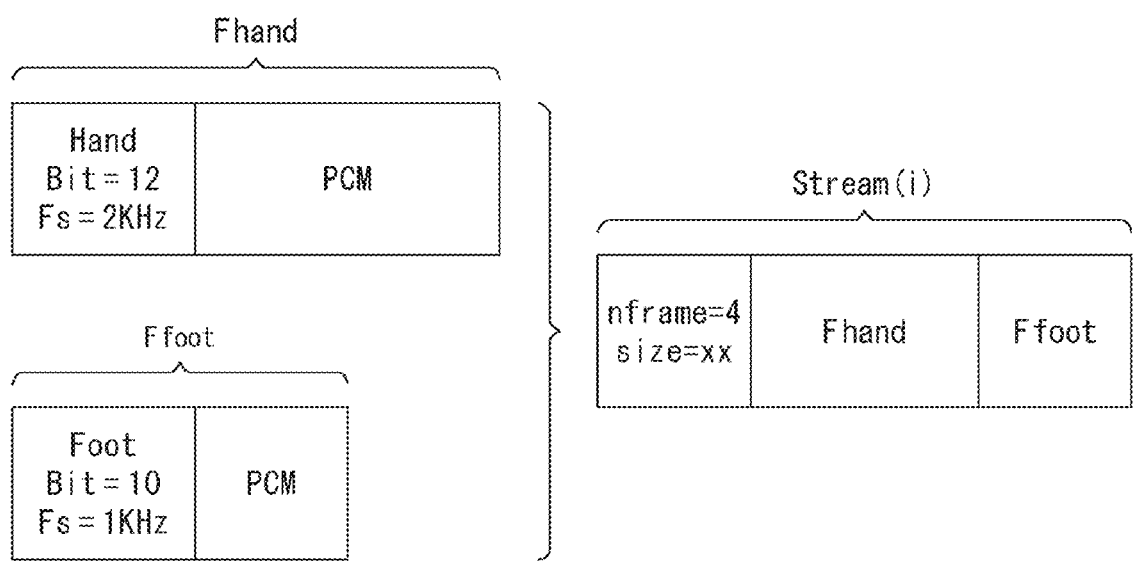
FIG. 10 is a diagram illustrating a structure example of coded data in a case where a data format of a tactile signal is differentiated for each region.

Here, as illustrated in FIG. 10 and the like, in a stream, header information indicating a section is added to a frame, and an actual tactile signal is recorded after the header information. If a temporal granularity of a tactile signal recorded in a frame is made too small, a percentage of a header occupying transmission increases and efficiency declines. In contrast, if the temporal granularity is made too large, a delay problem occurs or influence of interruption is received. Thus, it is desirable to encode a tactile signal of about several milliseconds, in the frame.

The frame of each region is transmitted by the above-described packet. Because a time taken for transmission becomes longer as the packet size becomes longer, interruption is easily received stochastically.

In view of the foregoing, in the second embodiment, frames are closed up in the order of a region with higher tactile sensitivity from the top side of the stream.

Figure 19:
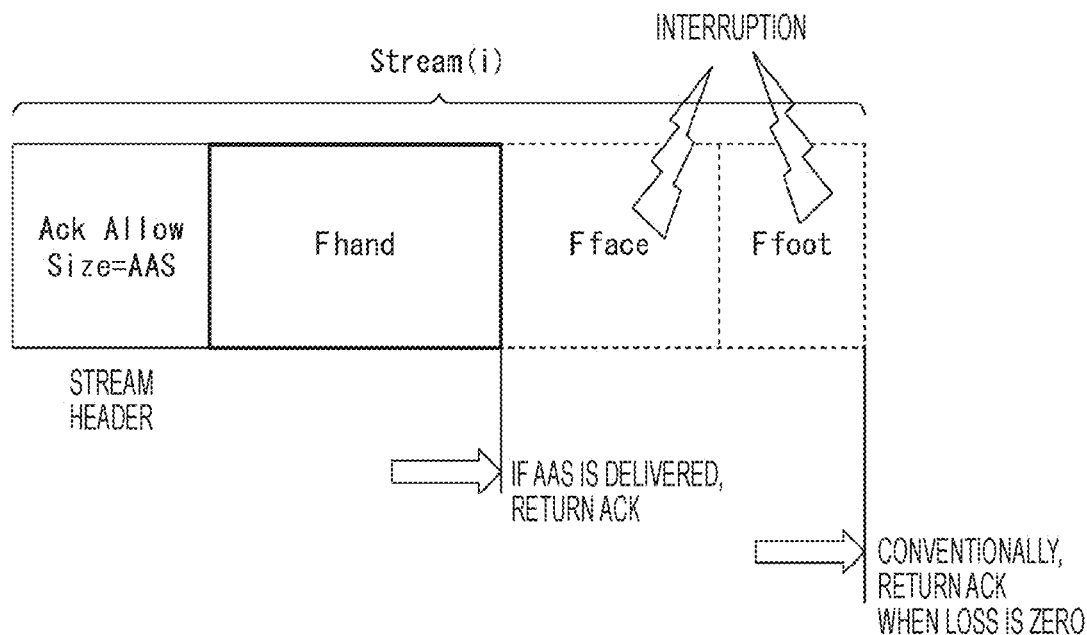
FIG. 19 is a diagram illustrating an example of an arrangement order of frames of respective regions in a case where tactile sensitivities become higher in the order of hand, face, and foot.

A specific example is illustrated in FIG. 19.

FIG. 19 illustrates an example of an arrangement order of frames of respective regions in a case where tactile sensitivities become higher in the order of hand, face, and foot.

In this case, in the stream, frames (tactile signal) of the respective regions are arranged from the top side in the order of hand, face, and foot.

In the conventional transmission, a receiving side returns acknowledge (ACK) upon the complete success in the reception of a packet.

In contrast to this, in the second embodiment, if the reception of only a frame with high tactile sensitivity, which is a part of the stream included in the packet, succeeds, ACK is returned. For this reason, a parameter indicating a size for allowing ACK to be returned upon the reception success is recorded in the stream header (refer to "Ack Allow Size" in FIG. 19). On the receiving side, if the reception success of a portion designated by the parameter is confirmed, ACK is returned to the transmitting side.

With this configuration, because it becomes equivalent to the transmission using an apparently short packet when being seen from a frame with high tactile sensitivity, the probability of interruption decreases. Even if loss occurs due to interruption in a frame with low tactile sensitivity, if data with high tactile sensitivity is reproduced, influence on a tactile sense of a human becomes relatively small, which is advantageous. In other words, a fixed amount of reproducibility of a tactile sense can be ensured.

Note that the above description has been given of an example in which a priority order in arranging frames is the height of tactile sensitivity, that is, a priority order that is based on the height of tactile sensitivity, but the priority order can be a priority order that is based on the magnitude of an amplitude of a tactile signal. That is, for example, a frame of a region in which an amplitude value of a tactile signal reaches a perceivable amplitude value is preferentially arranged in a stream (arranged on the top side), and the like.

Furthermore, in the above description, ACK is returned upon the reception of a frame of a region with the highest priority order. For example, ACK can be returned upon the reception of top n frames (n is natural number equal to or larger than two, and smaller than the total number of regions in the stream) in the priority order such as returning ACK upon the reception of top two signals in the priority order.

For obtaining the above-described effect equivalent to the transmission using an apparently short packet, ACK is only required to be returned upon the reception of a tactile signal of at least a region with the highest priority order excluding a region with the lowest priority order.

Here, as described above, even if an apparently short packet is used, because an interruption rate per unit time is constant, interruption within a time for transmitting the packet does not become zero.

Figure 20:
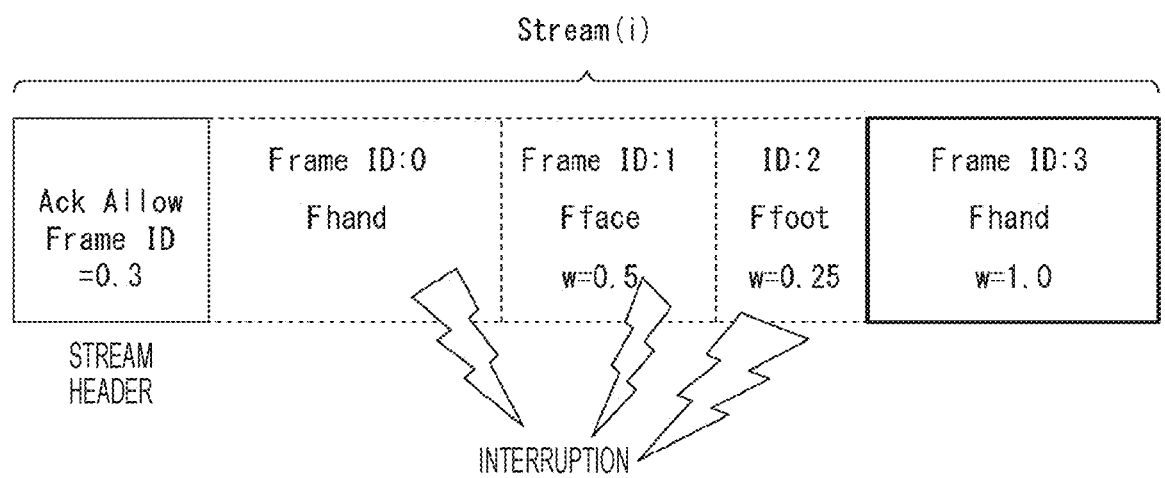
FIG. 20 is an explanatory diagram illustrating an example in which redundancy is applied to a tactile signal in accordance with a priority order of regions.

Thus, as exemplified in FIG. 20, frames with high tactile sensitivity (frames with high priority order) are arranged at a plurality of points in the stream, and transmitted with redundancy.

At this time, information indicating a frame for returning ACK upon the reception success, such as ID designation information designating a frame ID, for example, is stored in the stream header, and if the reception of at least one frame identified from the ID designation information succeeds, even if loss occurs in other frames, ACK is returned.

FIG. 20 illustrates an example in which, in a case where four frames having frame IDs=0 to 3 are arranged in one stream, when a frame of hand is arranged as a frame with the top ID=0, a frame of face is arranged as a frame with the second ID=1 from the top, a frame of foot is arranged as a frame with the third ID=2 from the top, and a frame of hand is arranged again as a frame with the fourth ID=3 from the top, ID designation information designating ID=0 and 3 is stored in the stream header.

With this configuration, if an interruption rate per unit time is constant, resistance to loss of a frame with high tactile sensitivity can be enhanced to multiple.

Note that, also in the above-described method, the priority order can also be a priority order that is based on the magnitude of a signal amplitude of a tactile signal instead of a priority order that is based on the height of tactile sensitivity.

Furthermore, the above description has been given of an example in which a region having redundancy of a tactile signal is limited to a region having the highest priority order, but top n regions (n is natural number equal to or larger than two, and smaller than the total number of regions in the stream) in the priority order can have redundancy of tactile signals.

(Functional Configuration of Transmitting Side)

Figure 21:
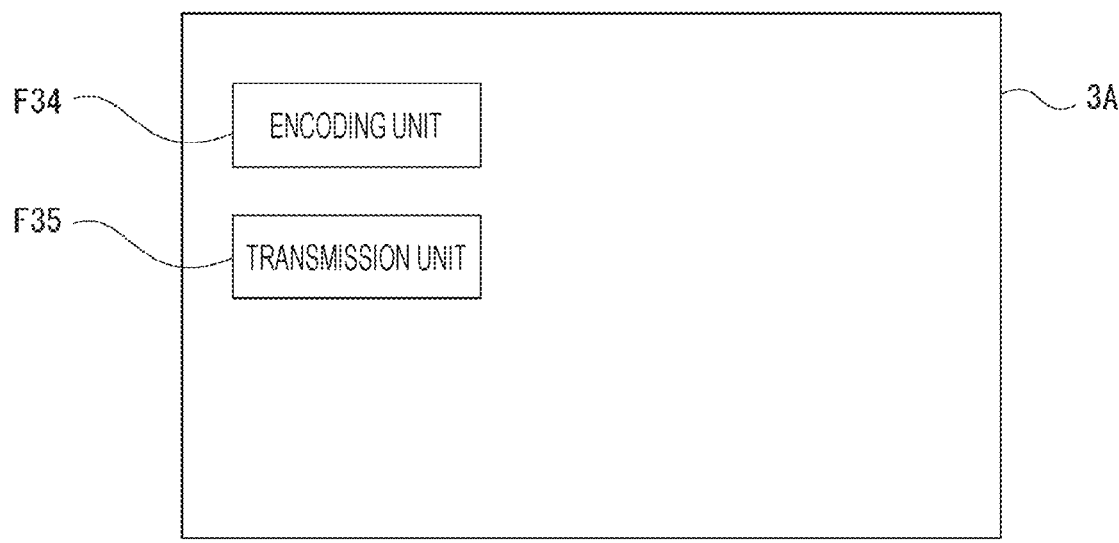
FIG. 21 is a functional block diagram illustrating a functional configuration of a transmission apparatus according to the second embodiment.

FIG. 21 is a functional block diagram illustrating a functional configuration of the transmission apparatus 3A.

As illustrated in the drawing, the transmission apparatus 3A includes functions as an encoding unit F34 and a transmission unit F35.

The encoding unit F34 generates coded data by performing encoding of arranging tactile signals of respective regions of a human body in accordance with priority orders of the respective regions. The function of the encoding unit F34 is implemented by the transmission data generation unit 51.

Here, the encoding unit F34 arranges tactile signals in order from the regions with higher priority orders. Specifically, regarding the function, as exemplified in FIG. 19 described above, the transmission data generation unit 51 generates coded data having a stream structure in which frames are arranged in order from the top side from regions with higher tactile sensitivity. At this time, the transmission data generation unit 51 stores a parameter corresponding to "Ack Allow Size" illustrated in FIG. 19, in the stream header.

Furthermore, the encoding unit F34 gives redundancy to a tactile signal of a region with a high priority order. Regarding the function, as exemplified in FIG. 20 described above, the transmission data generation unit 51 generates coded data in which redundancy is given only to a tactile signal of a region with the highest tactile sensitivity, for example. At this time, the transmission data generation unit 51 stores the above-described ID designation information into the stream header.

The transmission unit F35 transmits the coded data generated by the encoding unit F34. Specifically, on the basis of control of the control unit 35A, for example, the wireless communication unit 52 transmits coded data generated by the transmission data generation unit 51, to an external device (the receiving apparatus 40).

(Functional Configuration of Receiving Side)

Figure 22:
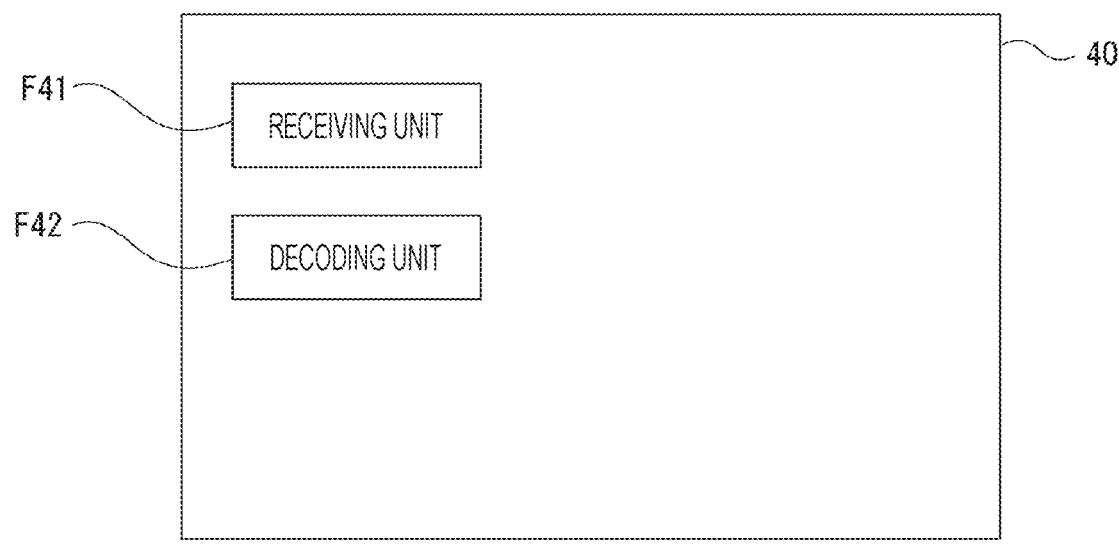
FIG. 22 is a functional block diagram illustrating a functional configuration of a receiving apparatus according to the second embodiment.

FIG. 22 is a functional block diagram illustrating a functional configuration of the receiving apparatus 40

As illustrated in the drawing, the receiving apparatus 40 includes functions as a receiving unit F41 and a decoding unit F42.

The receiving unit F41 receives coded data from the transmission apparatus that generates coded data by performing encoding of arranging tactile signals of respective regions of a human body in accordance with priority orders of the respective regions. That is, in this example, the receiving unit F41 receives coded data generated by the transmission data generation unit 51 of the transmission apparatus 3A. In this example, the wireless communication unit 43 corresponds to the receiving unit F41.

The decoding unit F42 performs decoding of the coded data received by the receiving unit F41, in accordance with the priority orders of the respective regions. In this example, the function as the decoding unit F42 is implemented by the decoding unit 34A.

Specifically, the decoding unit F42 performs the next processing in response to a case where tactile signals are arranged in order from regions with higher priority orders and transmitted. In other words, acknowledge is returned to the transmission apparatus upon the reception of at least a tactile signal of a region with the highest priority order excluding a region with the lowest priority order.

As the function of the decoding unit F42, for coded data generated by the transmission data generation unit 51 and received by the wireless communication unit 43, the decoding unit 34A refers to the above-described parameter stored in the stream header of the coded data, determines whether or not a frame identified from the parameter has been received (reception has succeeded), and returns ACK to the transmission apparatus 3A side upon it being determined that the frame has been received.

The decoding unit 34A repeatedly performs such processing for each stream.

Furthermore, in response to a case where a tactile signal is transmitted after giving redundancy to a region with high priority order, the decoding unit F42 returns acknowledge to the transmission apparatus upon the reception of at least one tactile signal of tactile signals of the regions to which the redundancy is given.

As the function of the decoding unit F42, for coded data generated by the transmission data generation unit 51 and received by the wireless communication unit 43, the decoding unit 34A refers to the above-described ID designation information stored in the stream header of the coded data, determines whether or not at least one frame among a plurality of frames indicated by the ID designation information has been received (reception has succeeded), and returns ACK to the transmission apparatus 3A side upon it being determined that the frame has been received.

The decoding unit 34A repeatedly performs such processing for each stream.

Here, the functions as the decoding unit F42 that have been described with reference to FIG. 22 can be implemented as software processing performed by a CPU and the like. The software processing is executed on the basis of a program, and the program is stored in a storage device from which programs can be read out by a computer device such as the CPU.

2-5. Conclusion of Second Embodiment

As described above, the transmission system according to the second embodiment includes the transmission apparatus (transmission apparatus 3A) including the encoding unit (encoding unit F34, the transmission data generation unit 51) that generates coded data by performing encoding of arranging tactile signals of respective regions of a human body in accordance with priority orders of the respective regions, and the transmission unit (transmission unit F35) that transmits the coded data, and the receiving apparatus (receiving apparatus 40) including the receiving unit (receiving unit F41, wireless communication unit 43) that receives the coded data transmitted by the transmission unit, and the decoding unit (decoding unit F42, 34A) that performs decoding of the coded data received by the receiving unit, in accordance with priority orders.

As described above, by transmitting tactile signals of the respective regions in the arrangement corresponding to priority orders, for example, it becomes possible to make data loss of a tactile signal of a region to be prioritized, such as a region with high tactile sensitivity, less likely to occur, and further decoding tactile signals to be transmitted in this manner, in accordance with the priority orders, even if data loss on a transmission path occurs, the data loss does not occur in a tactile signal of a region to be prioritized, only the received tactile signal of the region to be prioritized can be regarded as a target of tactile reproduction.

Thus, a transmission delay of a tactile signal that is caused by data loss on a transmission path can be made less likely to occur, and a reproducibility decline of a tactile sense that is caused by a transmission delay can be prevented.

Furthermore, the receiving apparatus (receiving apparatus 40) according to the second embodiment includes the transmission apparatus (transmission apparatus 3A) that generates coded data by performing encoding of arranging tactile signals of respective regions of a human body in accordance with priority orders of the respective regions, the receiving unit (receiving unit F41, wireless communication unit 43) that receives the coded data, and the decoding unit (decoding unit F42, 34A) that performs decoding of the coded data received by the receiving unit, in accordance with the priority orders.

By the transmission apparatus transmitting tactile signals of the respective regions in the arrangement corresponding to priority orders, for example, it becomes possible to make data loss of a tactile signal of a region to be prioritized, such as a region with high tactile sensitivity, less likely to occur, and further decoding tactile signals to be transmitted in this manner, in accordance with the priority orders, even if data loss on a transmission path occurs, the data loss does not occur in a tactile signal of a region to be prioritized, only the received tactile signal of the region to be prioritized can be regarded as a target of tactile reproduction.

Thus, a transmission delay of a tactile signal that is caused by data loss on a transmission path can be made less likely to occur, and a reproducibility decline of a tactile sense that is caused by a transmission delay can be prevented.

Furthermore, in the receiving apparatus according to the second embodiment, tactile signals of the respective regions are tactile signals of the respective regions having different tactile characteristics of the human body.

Therefore, the tactile reproduction can be performed for each of the regions having different tactile characteristics.

Thus, appropriate tactile reproduction suitable for a tactile characteristic of each region can be performed.

Moreover, in the receiving apparatus according to the second embodiment, the transmission apparatus transmits tactile signals arranged in order from regions with higher priority orders, and the decoding unit returns acknowledge to the transmission apparatus upon the reception of at least a tactile signal of a region with the highest priority order excluding a region with the lowest priority order.

Therefore, a tactile signal of a region with a high priority order becomes equivalent to transmission of a signal using a short packet.

Thus, an occurrence rate of data loss of a tactile signal can be reduced for a region with a high priority order, and a decline in tactile sense reproducibility can be prevented.

Moreover, furthermore, in the receiving apparatus according to the second embodiment, a priority order is a priority order that is based on perceptibility of tactile stimulation.

Therefore, for example, for a region with a high priority order that is based on perceptibility of tactile stimulation such as the height of tactile sensitivity and the magnitude of a signal amplitude, data loss of a tactile signal can be made less likely to occur.

Thus, a decline in tactile sense reproducibility can be prevented.

Furthermore, in the receiving apparatus according to the second embodiment, a priority order is a priority order that is based on the height of tactile sensitivity.

Therefore, for a region in which tactile stimulation is easily perceived from the aspect of sensitivity to tactile stimulation, data loss of a tactile signal can be made less likely to occur.

Thus, a decline in tactile sense reproducibility can be prevented.

Moreover, in the receiving apparatus according to the second embodiment, a priority order is a priority order that is based on the magnitude of the amplitude of a tactile signal.

Therefore, for a region in which tactile stimulation is easily perceived from the aspect of the magnitude of the amplitude of a tactile signal, data loss of a tactile signal can be made less likely to occur.

Thus, a decline in tactile sense reproducibility can be prevented.

Moreover, furthermore, in the receiving apparatus according to the second embodiment, the transmission apparatus transmits tactile signals after giving redundancy to regions with high priority orders, and the decoding unit returns acknowledge to the transmission apparatus upon the reception of at least one tactile signal of the tactile signals of the regions to which the redundancy is given.

Therefore, it becomes possible to make data loss of a tactile signal less likely to occur.

Thus, a decline in tactile sense reproducibility can be prevented.

Furthermore, the decoding method according to the second embodiment is a decoding method of performing decoding of coded data received from the transmission apparatus that generates coded data by performing encoding of arranging tactile signals of respective regions of a human body in accordance with priority orders of the respective regions, in accordance with the priority orders.

Also according to such a decoding method according to the second embodiment, functions and effects that are similar to those of the above-described receiving apparatus according to the second embodiment can be obtained.

Furthermore, a program according to the second embodiment is a program for causing an information processing apparatus to implement a function of performing decoding of coded data received from the transmission apparatus that generates coded data by performing encoding of arranging tactile signals of respective regions of a human body in accordance with priority orders of the respective regions, in accordance with the priority orders.

According to such a program, the above-described receiving apparatus according to the second embodiment can be implemented.

Note that effects described in this specification are mere exemplifications and are not limited, and other effects may be caused.

3. Present Technology

Note that the present technology can also employ the following configurations.

(1)
A decoding apparatus including:
a decoding unit configured to decode tactile signals encoded using different data formats between different regions of a human body.

(2)
The decoding apparatus according to (1) described above,
in which the decoding unit decodes tactile signal having different data formats between regions having different tactile characteristics of a human body.

(3)
The decoding apparatus according to (1) or (2) described above,
in which the decoding unit decodes tactile signals having data formats of the respective regions defined in such a manner as to vary a bit distribution for the regions in accordance with tactile sensitivity.

(4)
The decoding apparatus according to (3) described above,
in which the decoding unit decodes tactile signals having different quantization bit lengths between the different regions.

(5)
The decoding apparatus according to (3) or (4) described above,
in which the decoding unit decodes tactile signals having different sampling frequencies between the different regions.

(6)
The decoding apparatus according to any of (1) to (5) described above,
in which the decoding unit includes a format conversion unit configured to input tactile signals being different in at least either a quantization bit length or a sampling frequency between the different regions, and convert at least either a quantization bit length or a sampling frequency of at least any tactile signal of tactile signals of the respective regions.

(7)
The decoding apparatus according to any of (1) to (6) described above,
in which the decoding unit inputs the tactile signal to which index information indicating a type of the region is added, and performs decoding of the tactile signals of the respective regions on the basis of the index information.

(8)
A receiving apparatus including:
a receiving unit configured to receive, from a transmission apparatus configured to generate coded data by performing encoding of arranging tactile signals of respective regions of a human body in accordance with priority orders of the respective regions, the coded data; and a decoding unit configured to perform decoding of the coded data received by the receiving unit, in accordance with the priority orders.

(9)
The receiving apparatus according to (8) described above,
in which tactile signals of the respective regions are tactile signals of the respective regions having different tactile characteristics of a human body.

(10)
The receiving apparatus according to (8) or (9) described above,
in which the transmission apparatus transmits the tactile signals arranged in order from the regions with the higher priority orders, and
the decoding unit returns acknowledge to the transmission apparatus upon reception of at least a tactile signal of the region with the highest priority order excluding a region with the lowest priority order.

(11)
The receiving apparatus according to (10) described above,
in which the priority order is a priority order that is based on a height of tactile sensitivity.

(12)
The receiving apparatus according to any of (8) to (11) described above,
in which the transmission apparatus transmits tactile signals after giving redundancy to the regions with the high priority orders, and
the decoding unit returns acknowledge to the transmission apparatus upon reception of at least one tactile signal of the tactile signals of the regions to which the redundancy is given.

REFERENCE SIGNS LIST 1, 1A Tactile reproduction system
2 Encoding apparatus
3 Decoding apparatus
3A Transmission apparatus
5 Tactile sensor
6 Tactile presentation apparatus
22 A/D converter
24 Encoding unit
F21 Acquisition unit
F22 Encoding unit
32 D/A converter
34, 34A Decoding unit
35A Control unit
37 Communication unit
F31 Acquisition unit
F32 Reproduction unit
F23, F33 Format conversion unit
F34 Encoding unit
F35 Transmission unit
Receiving apparatus
43 Wireless communication unit
51 Transmission data transmission unit
52 Wireless communication unit
F41 Receiving unit
F42 Decoding unit

The invention claimed is:

1. An encoding apparatus comprising:
   encoding circuitry configured to encode tactile signals from different regions of a human body, the encoding circuitry being configured to:
   encode a first tactile signal from a first region of the human body using a first sampling frequency and a first quantization bit length;
   encode a second tactile signal from a second region of the human body using a second sampling frequency and a second quantization bit length; and
   combine the encoded first and second tactile signals into a data stream for transmission, wherein at least one of the first sampling frequency and the first quantization bit length is different from the respective second sampling frequency and second quantization bit length.

2. The encoding apparatus according to claim 1, wherein the first sampling frequency is different from the second sampling frequency.

3. The encoding apparatus according to claim 1, wherein the first quantization bit length is different from the second quantization bit length.

4. An encoding method executed by encoding circuitry, the method comprising:
   encoding a first tactile signal from a first region of the human body using a first sampling frequency and a first quantization bit length;
   encoding a second tactile signal from a second region of the human body using a second sampling frequency and a second quantization bit length; and
   combining the encoded first and second tactile signals into a data stream for transmission, wherein at least one of the first sampling frequency and the first quantization bit length is different from the respective second sampling frequency and second quantization bit length.

5. A non-transitory computer readable medium storing instructions that, when executed by encoding circuitry, perform an encoding method comprising:
   encoding a first tactile signal from a first region of the human body using a first sampling frequency and a first quantization bit length;
   encoding a second tactile signal from a second region of the human body using a second sampling frequency and a second quantization bit length; and
   combining the encoded first and second tactile signals into a data stream for transmission, wherein at least one of the first sampling frequency and the first quantization bit length is different from the respective second sampling frequency and second quantization bit length.

6. A decoding apparatus comprising:
   decoding circuitry configured to decode encoded tactile signals from different regions of a human body, the decoding circuitry being configured to:
   acquire a data stream including a first encoded tactile signal having a first sampling frequency and a first quantization bit length and a second encoded tactile signal having a second sampling frequency and a second quantization bit length;
   decode the first encoded tactile signal having the first sampling frequency and the first quantization bit length; and
   decode the second encoded tactile signal having the second sampling frequency and the second quantization bit length, wherein at least one of the first sampling frequency and the first quantization bit length is different from the respective second sampling frequency and second quantization bit length.

7. The decoding apparatus according to claim 6, wherein the decoding circuitry is configured to decode tactile signals of the respective regions defined in such a manner as to vary a bit distribution for the regions in accordance with tactile sensitivity.

8. The decoding apparatus according to claim 7, wherein the decoding circuitry is configured to decode tactile signals having different quantization bit lengths between the different regions.

9. The decoding apparatus according to claim 7, wherein the decoding circuitry is configured to decode tactile signals having different sampling frequencies between the different regions.

10. The decoding apparatus according to claim 6, wherein the decoding circuitry is configured to convert at least either a quantization bit length or a sampling frequency of at least any tactile signal of tactile signals of the respective regions.

11. The decoding apparatus according to claim 6, wherein the decoding circuitry is configured to acquire tactile signals to which index information indicating a type of the region is added, and to perform decoding of the tactile signals of the respective regions on a basis of the index information.

12. A decoding method executed by decoding circuitry, the method comprising:
    decoding encoded tactile signals from different regions of a human body, wherein the decoding includes:
    acquiring a data stream including a first encoded tactile signal having a first sampling frequency and a first quantization bit length and a second encoded tactile signal having a second sampling frequency and a second quantization bit length;
    decoding the first encoded tactile signal having the first sampling frequency and the first quantization bit length; and
    decoding the second encoded tactile signal having the second sampling frequency and the second quantization bit length, wherein at least one of the first sampling frequency and the first quantization bit length is different from the respective second sampling frequency and second quantization bit length.

13. The decoding method according to claim 12, wherein the first sampling frequency is different from the second sampling frequency.

14. The decoding method according to claim 12, wherein the first quantization bit length is different from the second quantization bit length.

15. A non-transitory computer readable medium storing instructions that, when executed by decoding circuitry, perform a decoding method comprising:
    decoding encoded tactile signals from different regions of a human body, wherein the decoding includes:
    acquiring a data stream including a first encoded tactile signal having a first sampling frequency and a first quantization bit length and a second encoded tactile signal having a second sampling frequency and a second quantization bit length;
    decoding the first encoded tactile signal having the first sampling frequency and the first quantization bit length; and
    decoding the second encoded tactile signal having the second sampling frequency and the second quantization bit length, wherein at least one of the first sampling frequency and the first quantization bit length is different from the respective second sampling frequency and second quantization bit length.

* * * * *